(12) United States Patent
Pachamuthu et al.

(10) Patent No.: US 9,842,851 B2
(45) Date of Patent: Dec. 12, 2017

(54) THREE-DIMENSIONAL MEMORY DEVICES HAVING A SHAPED EPITAXIAL CHANNEL PORTION

(71) Applicant: SANDISK TECHNOLOGIES INC., Plano, TX (US)

(72) Inventors: Jayavel Pachamuthu, San Jose, CA (US); Tuan Pham, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/927,990

(22) Filed: Oct. 30, 2015

(65) Prior Publication Data
US 2017/0125438 A1  May 4, 2017

(51) Int. Cl.
| | |
|---|---|
| *H01L 27/11* | (2006.01) |
| *H01L 29/78* | (2006.01) |
| *H01L 27/11582* | (2017.01) |
| *H01L 27/1157* | (2017.01) |
| *H01L 21/311* | (2006.01) |

(52) U.S. Cl.
CPC ... *H01L 27/11582* (2013.01); *H01L 21/31111* (2013.01); *H01L 27/1157* (2013.01)

(58) Field of Classification Search
CPC ......... H01L 27/11582; H01L 27/11524; H01L 27/11556; H01L 27/1157; H01L 29/7883
See application file for complete search history.

(56) References Cited

U.S. PATENT DOCUMENTS

| | | |
|---|---|---|
| 5,915,167 A | 6/1999 | Leedy |
| 9,023,719 B2 | 5/2015 | Pachamuthu et al. |
| 9,035,372 B2 * | 5/2015 | Song .................. H01L 29/78 257/314 |
| 9,230,973 B2 | 1/2016 | Pachamuthu et al. |
| 9,230,979 B1 * | 1/2016 | Pachamuthu ..... H01L 27/11575 |
| 9,230,980 B2 * | 1/2016 | Rabkin .............. G11C 16/0483 |
| 9,230,987 B2 | 1/2016 | Pachamuthu et al. |

(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.

(Continued)

*Primary Examiner* — Ida M Soward
(74) *Attorney, Agent, or Firm* — The Marbury Law Group PLLC

(57) ABSTRACT

An alternating stack of insulating layers and sacrificial material layers is formed over a substrate. A dielectric collar structure can be formed prior to formation of an epitaxial channel portion, and can be employed to protect the epitaxial channel portion during replacement of the sacrificial material layers with electrically conductive layers. Exposure of the epitaxial channel portion to an etchant during removal of the sacrificial material layers is avoided through use of the dielectric collar structure. Additionally or alternatively, facets on the top surface of the epitaxial channel portion can be reduced or eliminated by forming the epitaxial channel portion to a height that exceeds a target height, and by recessing a top portion of the epitaxial channel portion. The recess etch can remove protruding portions of the epitaxial channel portion at a greater removal rate than a non-protruding portion.

12 Claims, 38 Drawing Sheets

(56) References Cited

U.S. PATENT DOCUMENTS

| | | | |
|---|---|---|---|
| 9,246,088 B2* | 1/2016 | Yamato | H01L 45/1226 |
| 9,356,043 B1* | 5/2016 | Sakakibara | H01L 27/11582 |
| 2007/0252201 A1 | 11/2007 | Kito et al. | |
| 2014/0054676 A1 | 2/2014 | Nam et al. | |
| 2014/0198553 A1* | 7/2014 | Lung | G11C 13/0004 |
| | | | 365/63 |
| 2014/0264548 A1* | 9/2014 | Lee | H01L 27/11582 |
| | | | 257/324 |
| 2014/0284691 A1 | 9/2014 | Takamura et al. | |
| 2014/0332875 A1 | 11/2014 | Kim et al. | |
| 2015/0060977 A1 | 3/2015 | Lee et al. | |
| 2015/0104916 A1* | 4/2015 | Lee | H01L 27/1157 |
| | | | 438/268 |
| 2015/0115348 A1 | 4/2015 | Nam et al. | |
| 2015/0179660 A1* | 6/2015 | Yada | H01L 21/02164 |
| | | | 257/321 |
| 2015/0294978 A1* | 10/2015 | Lu | H01L 27/1157 |
| | | | 438/269 |
| 2016/0056169 A1* | 2/2016 | Lee | H01L 27/11565 |
| | | | 438/269 |
| 2016/0099289 A1* | 4/2016 | Yamato | H01L 45/1226 |
| | | | 257/4 |
| 2016/0111432 A1* | 4/2016 | Rabkin | G11C 16/0483 |
| | | | 257/314 |
| 2016/0126253 A1 | 5/2016 | Lee et al. | |
| 2016/0141294 A1* | 5/2016 | Peri | H01L 21/28512 |
| | | | 257/324 |
| 2016/0268302 A1* | 9/2016 | Lee | H01L 27/11582 |
| 2016/0276365 A1 | 9/2016 | Choi et al. | |
| 2016/0284726 A1* | 9/2016 | Sakakibara | H01L 27/11582 |
| 2016/0329101 A1* | 11/2016 | Sakakibara | G11C 16/0483 |
| 2016/0329343 A1* | 11/2016 | Pachamuthu | H01L 27/11582 |

OTHER PUBLICATIONS

U.S. Appl. No. 14/314,274, filed Jun. 27, 2014, Sandisk Corporation.
U.S. Appl. No. 14/341,079, filed Jul. 25, 2014, Sandisk Corporation.
U.S. Appl. No. 14/643,280, filed Mar. 10, 2014, Sandisk Corporation.
U.S. Appl. No. 14/927,708, filed Oct. 30, 2015, Sandisk Corporation.
Non-Final Office Action for U.S. Appl. No. 14/927,708, dated Nov. 25, 2016, 22 pages.
U.S. Appl. No. 14/927,708, Notice of Allowance dated May 10, 2017, 14pgs.

* cited by examiner

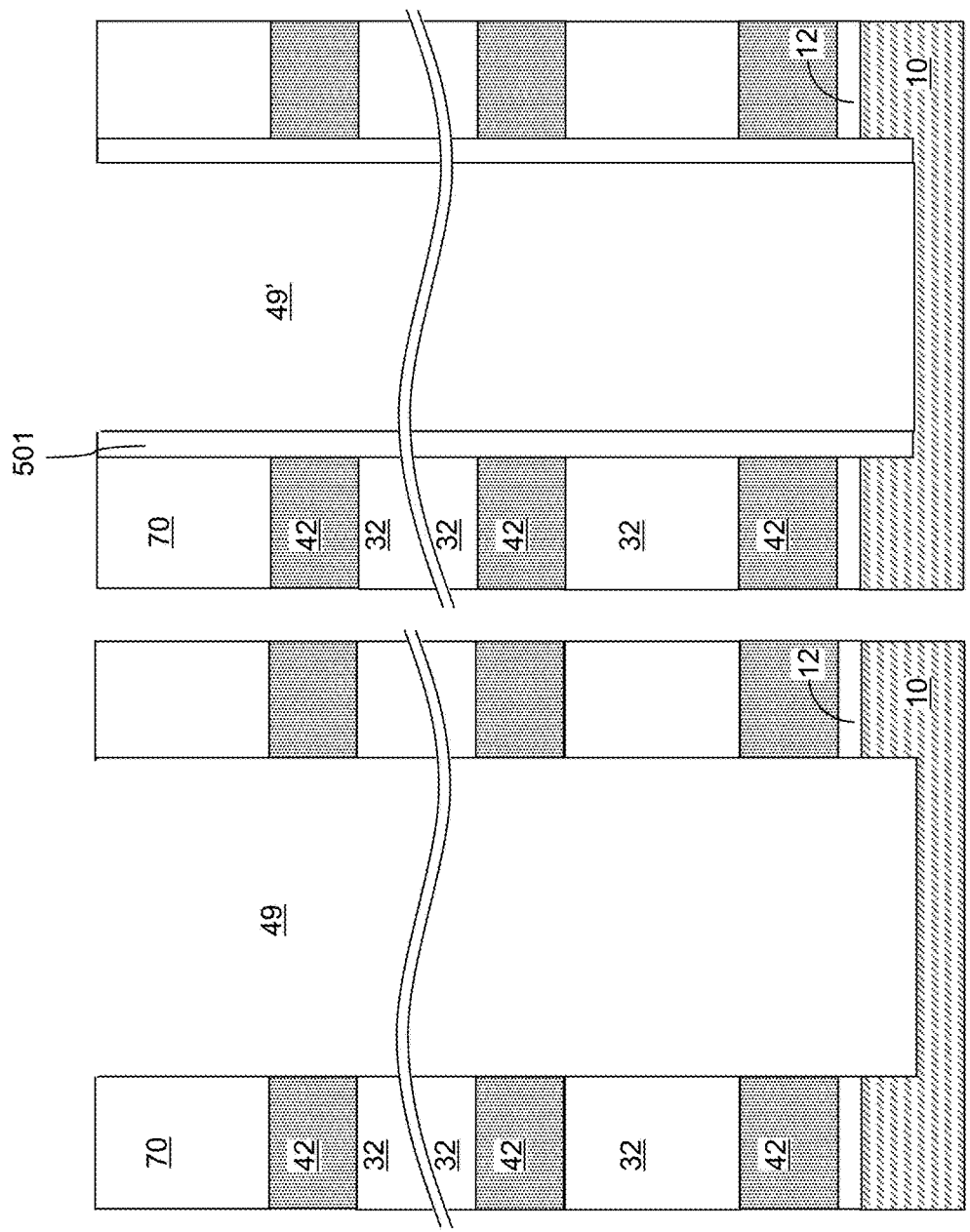

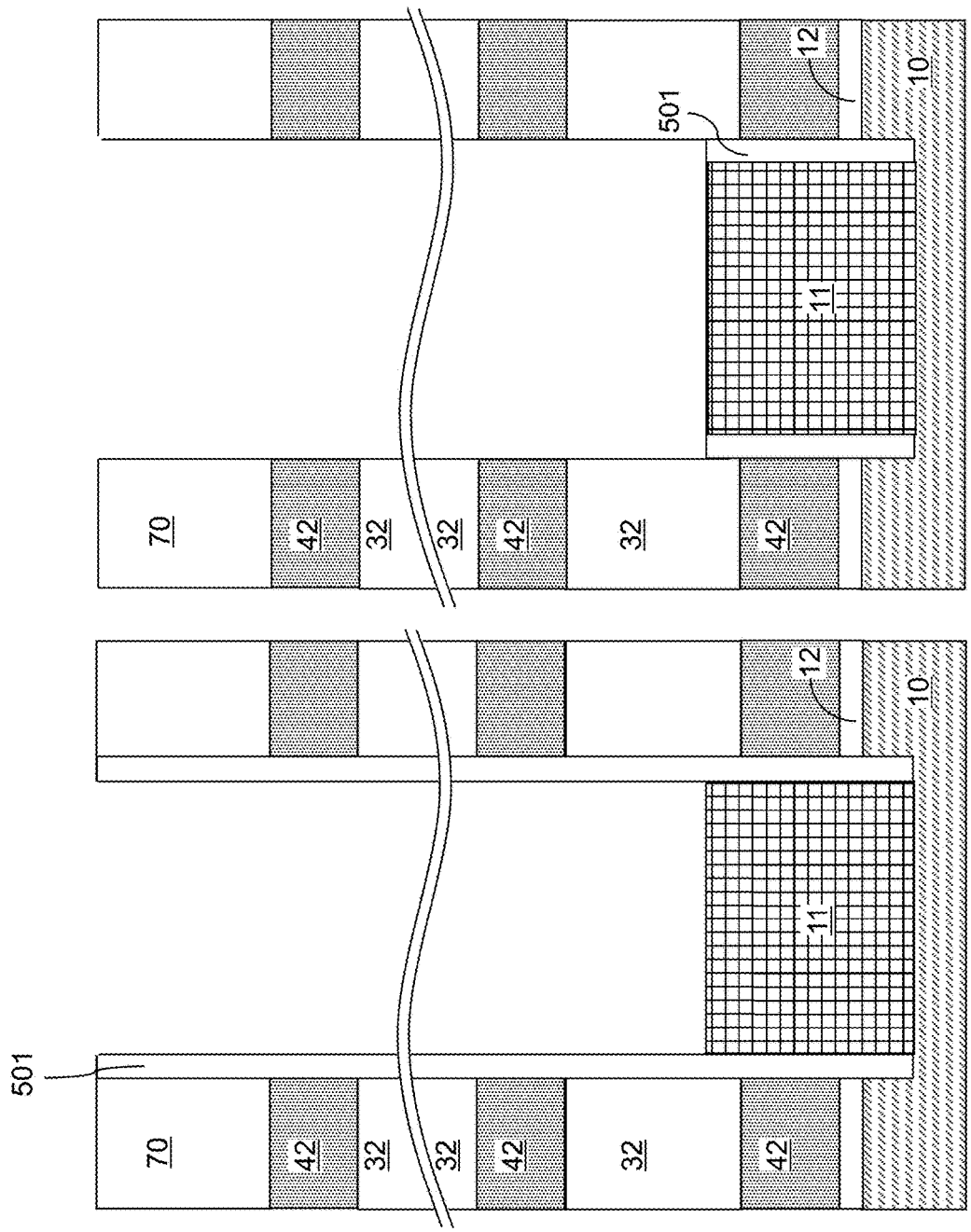

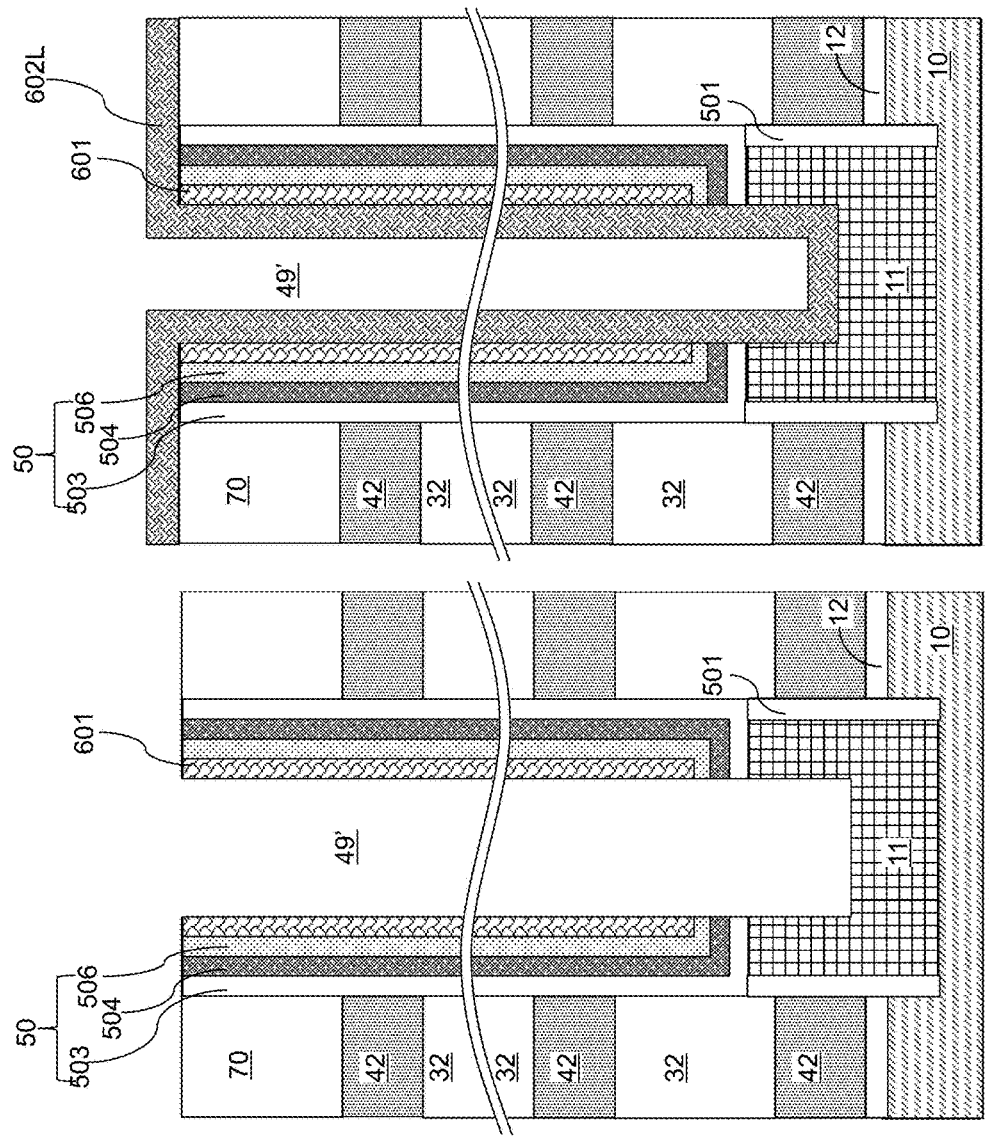

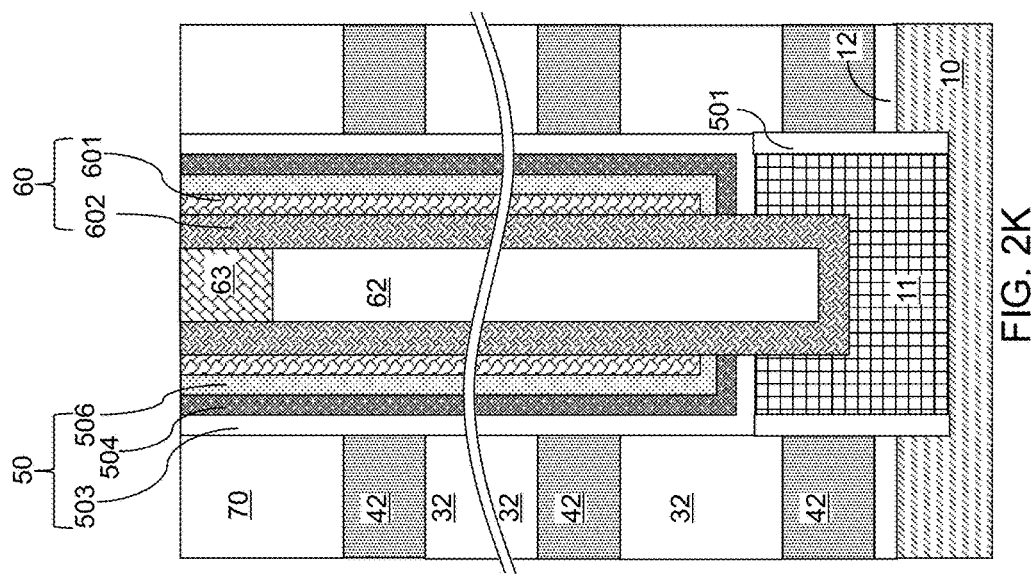

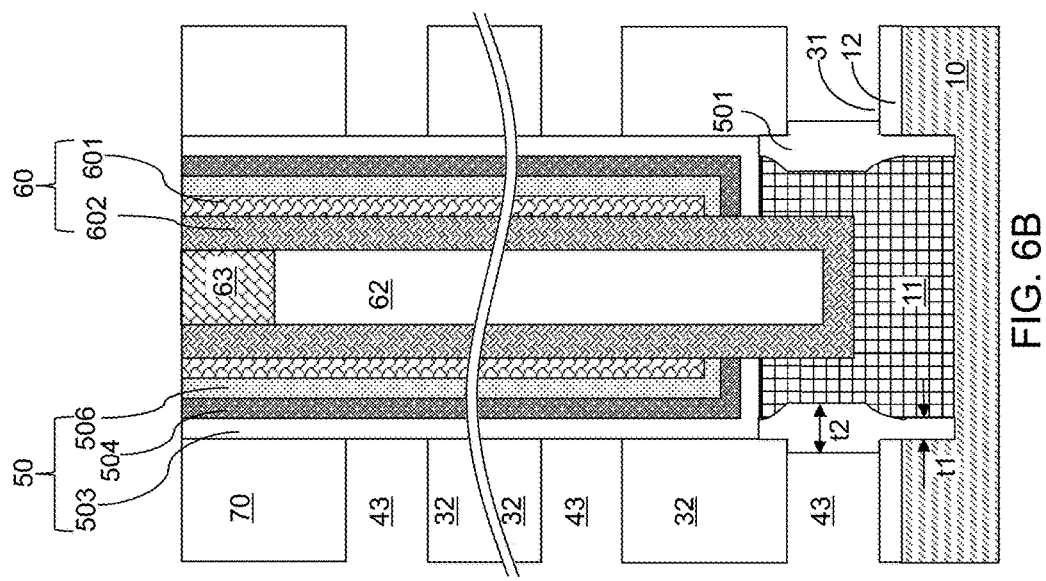

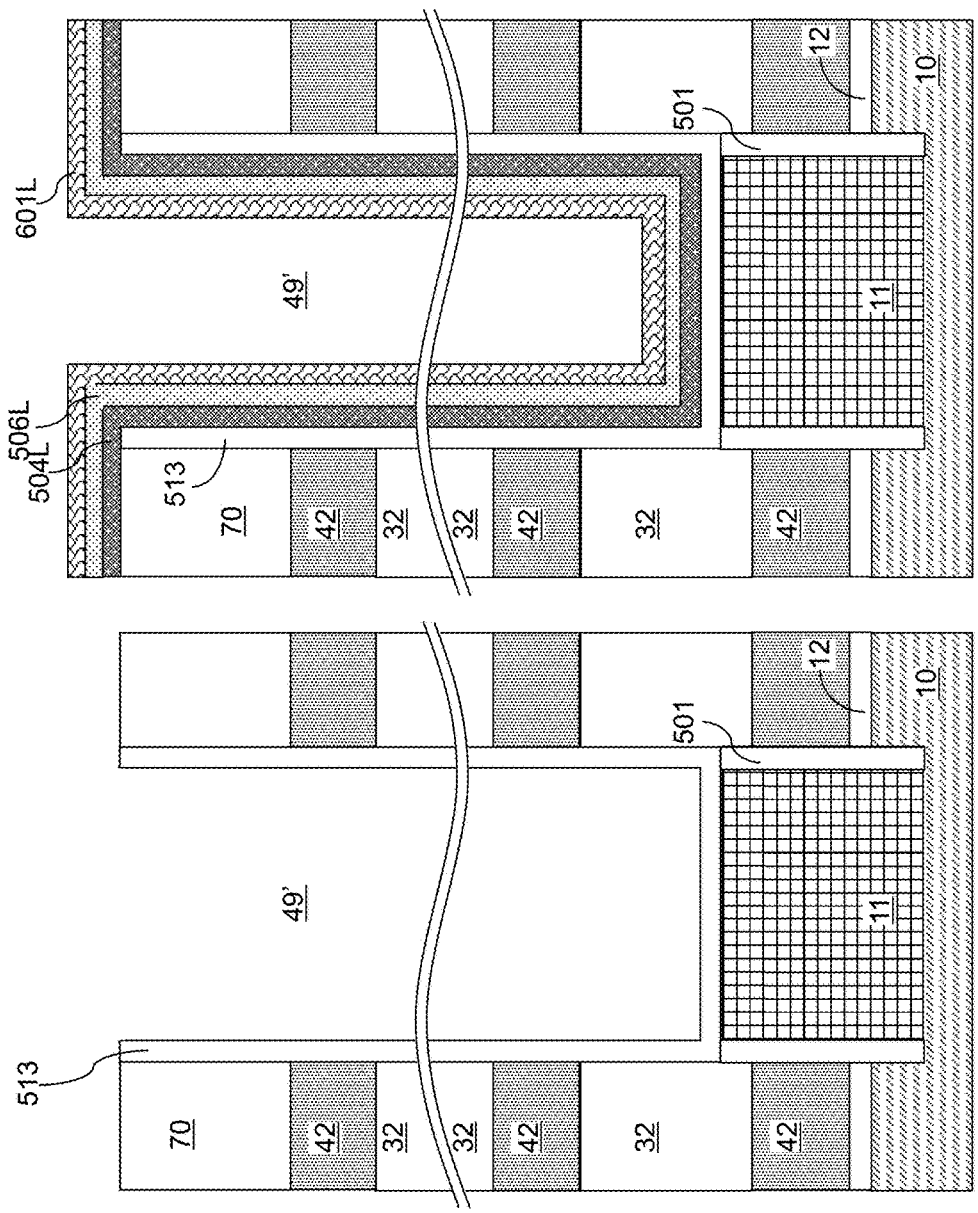

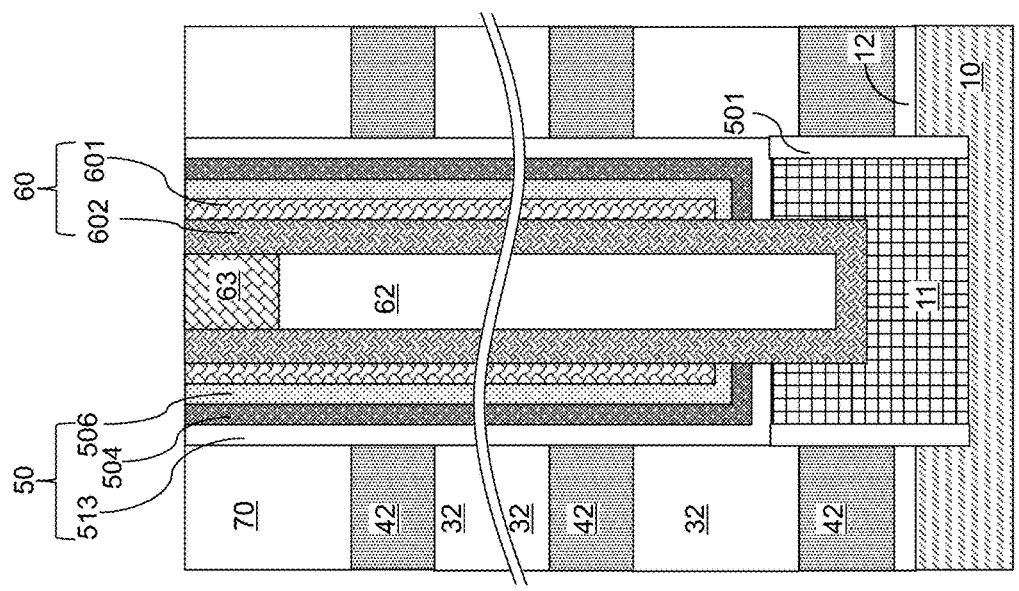
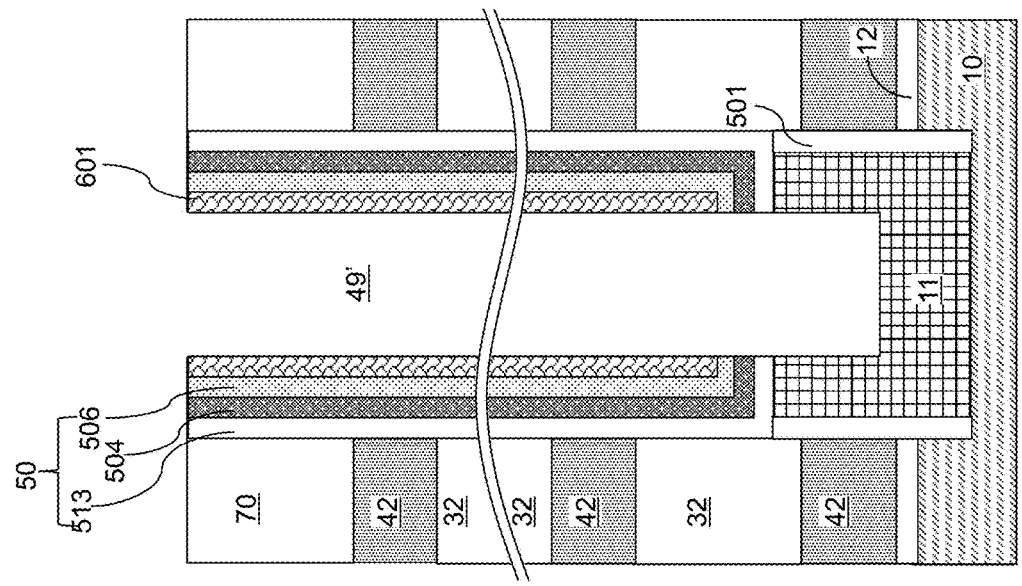

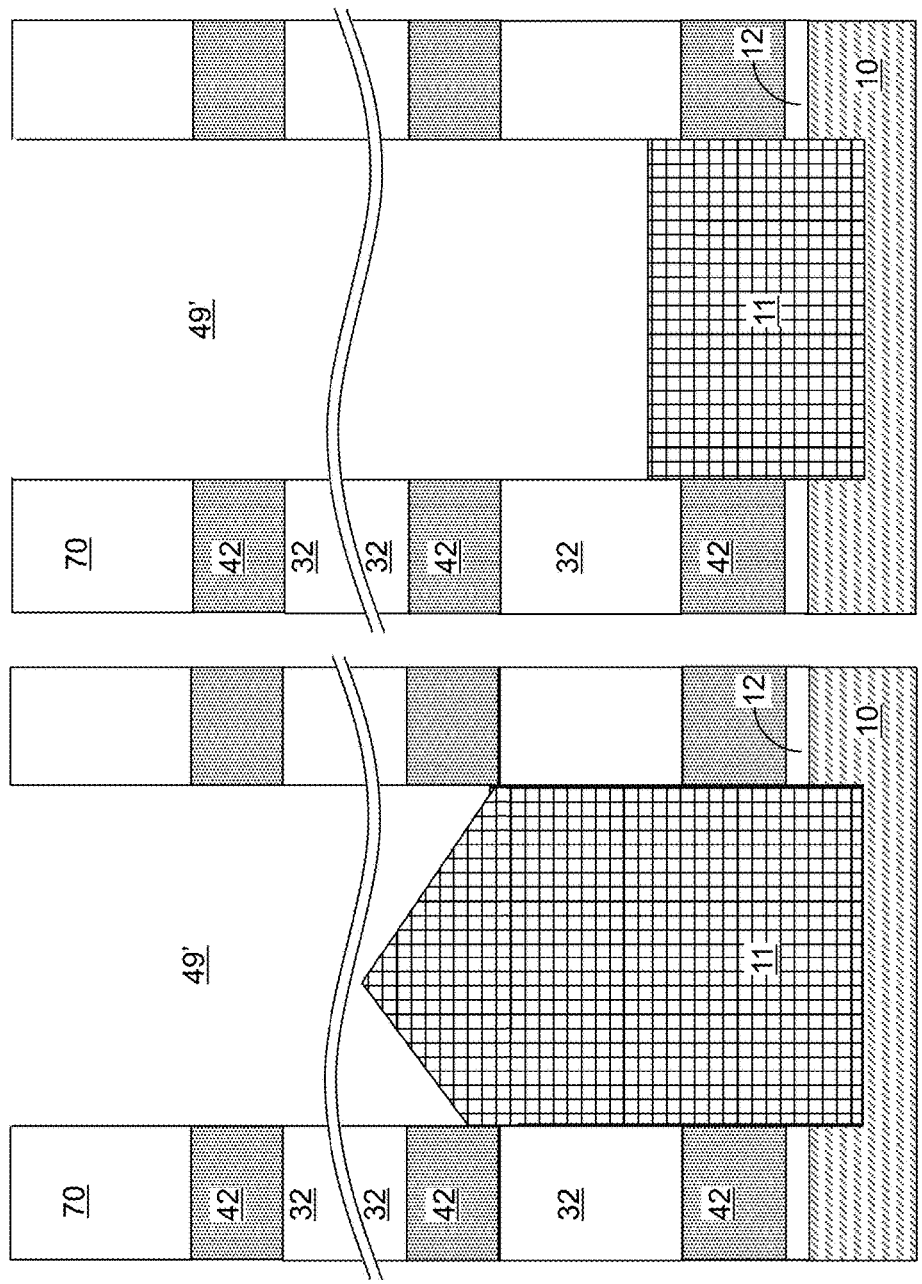

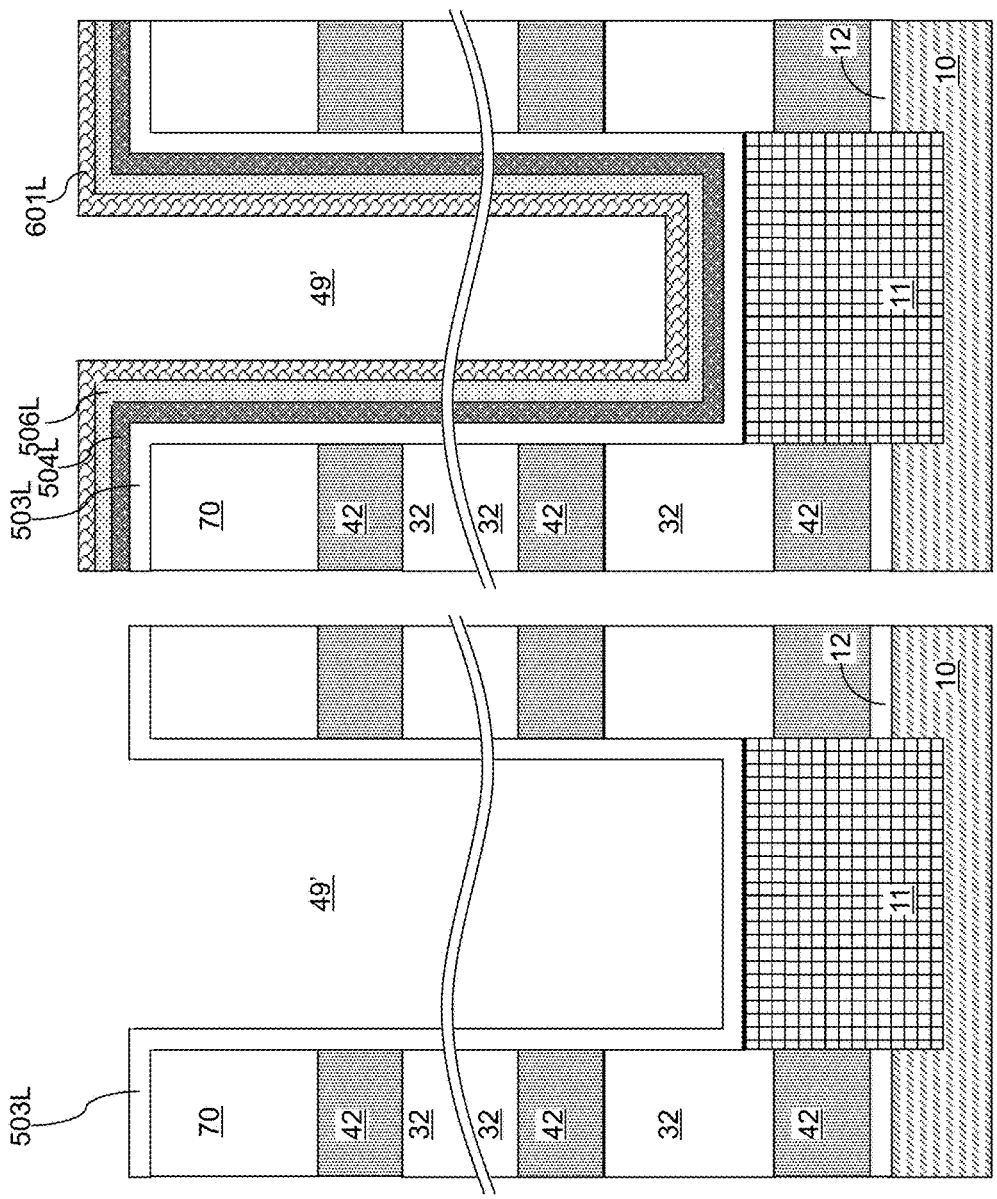

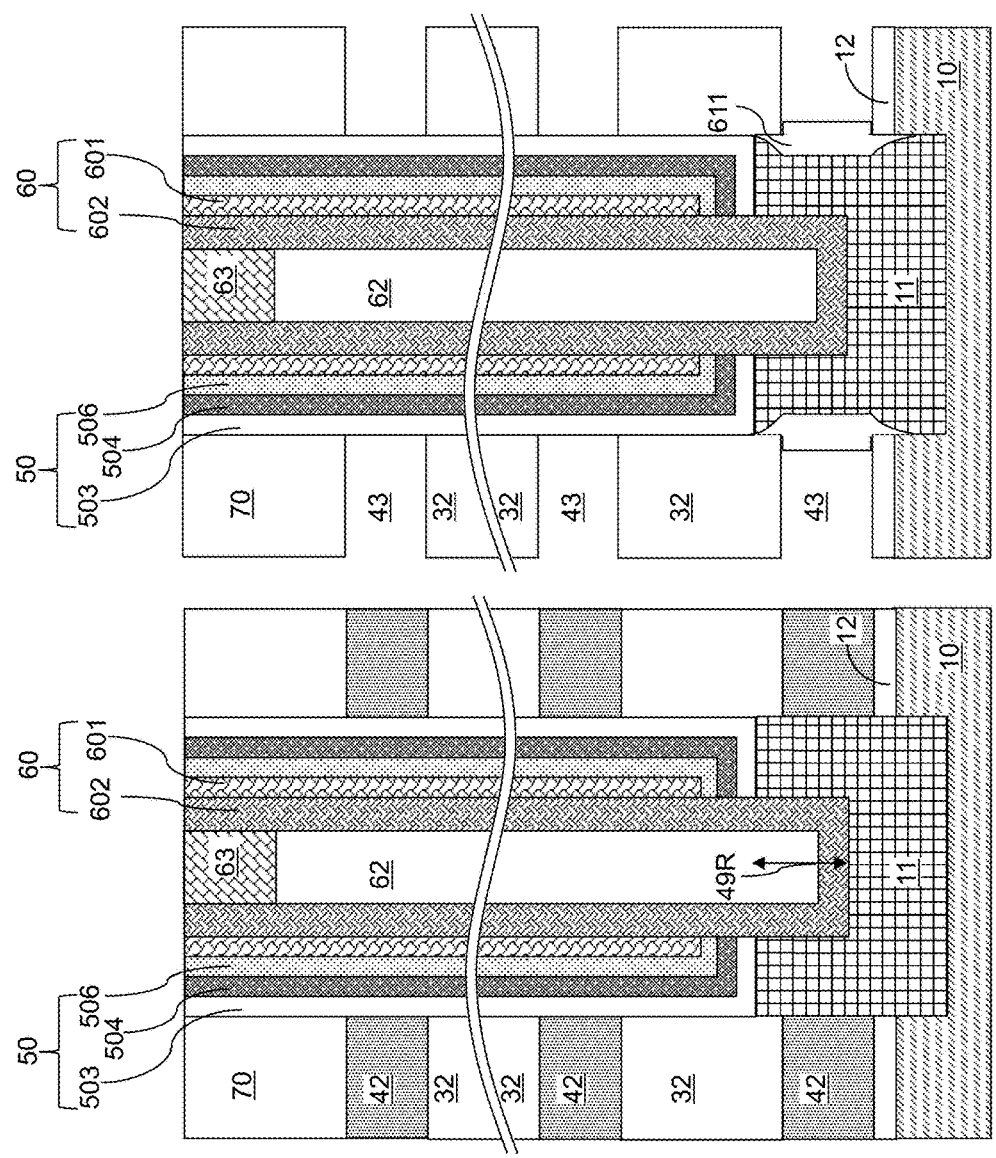

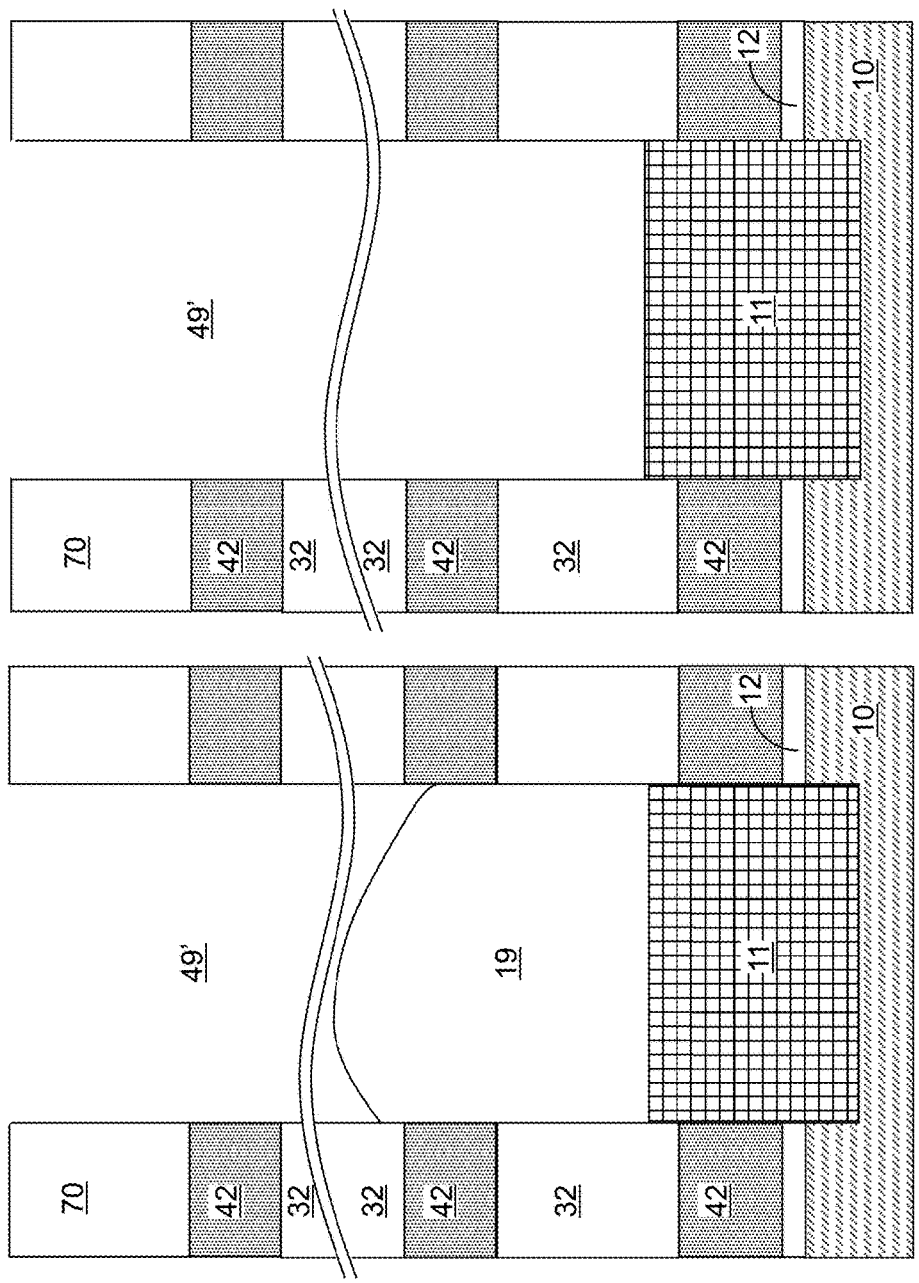

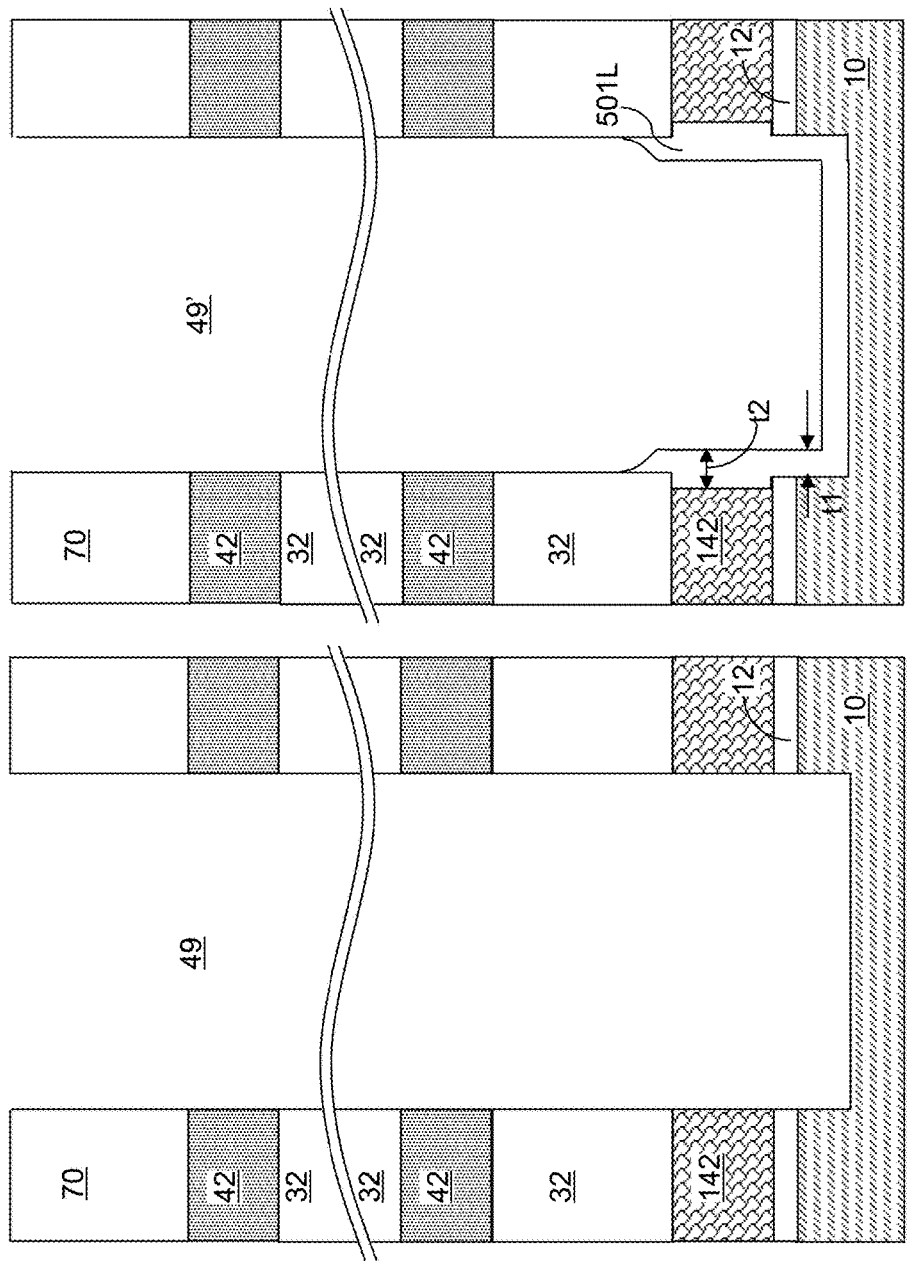

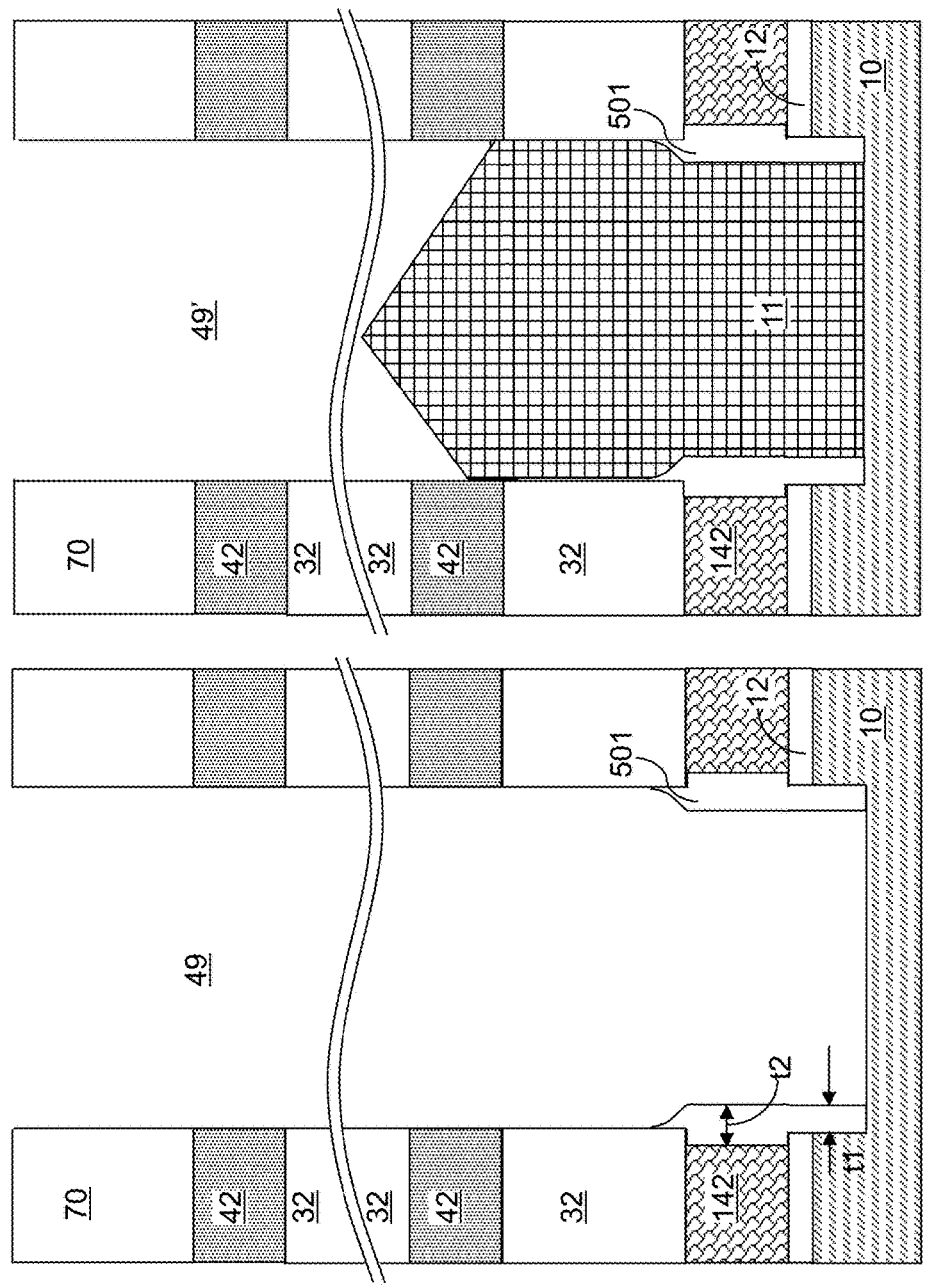

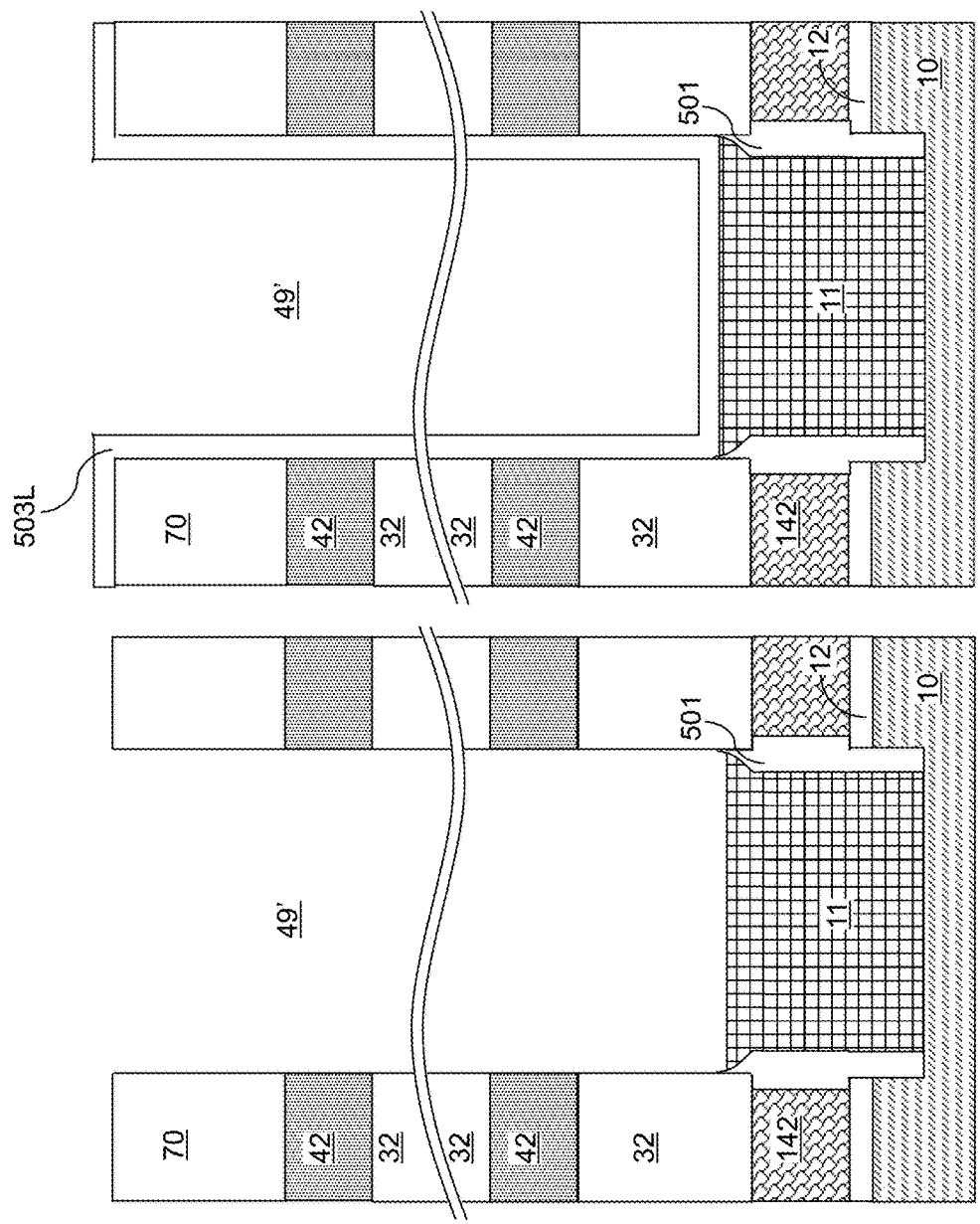

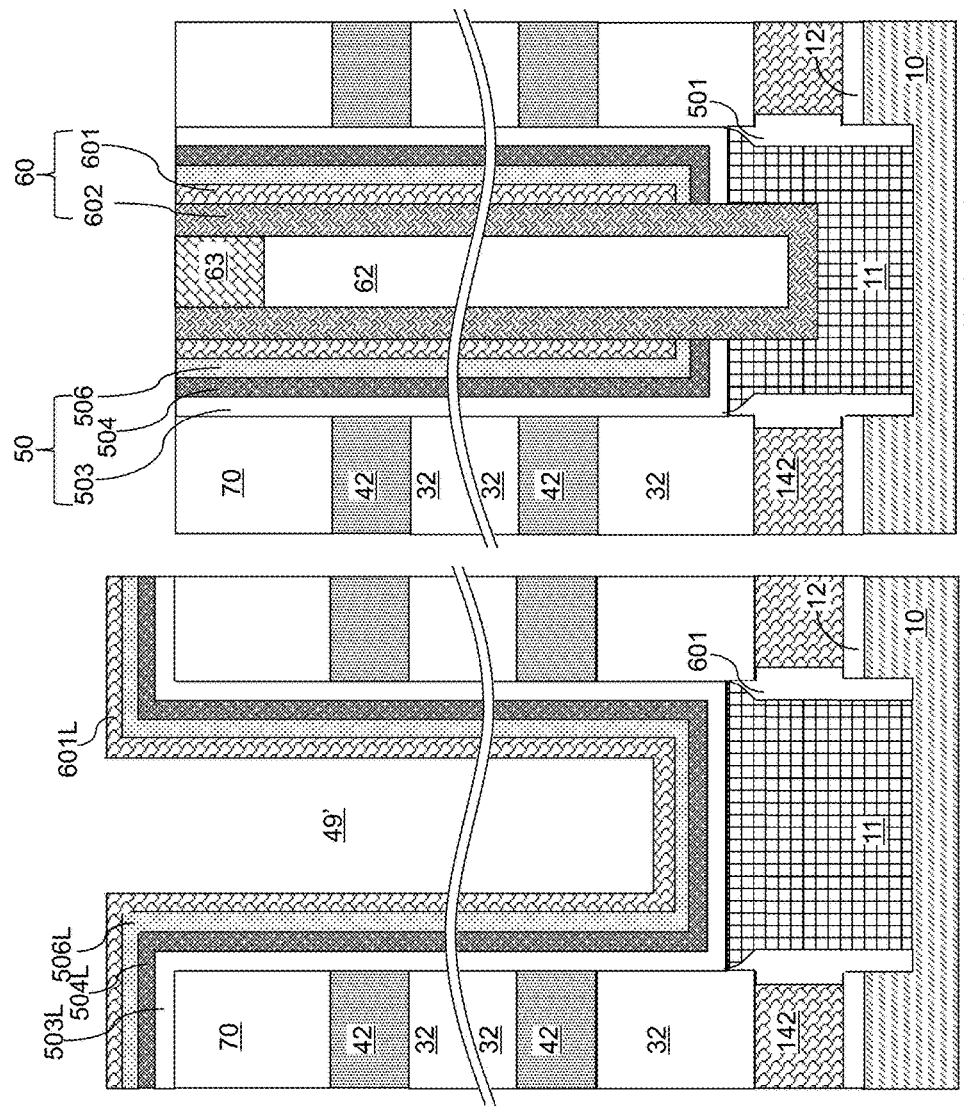

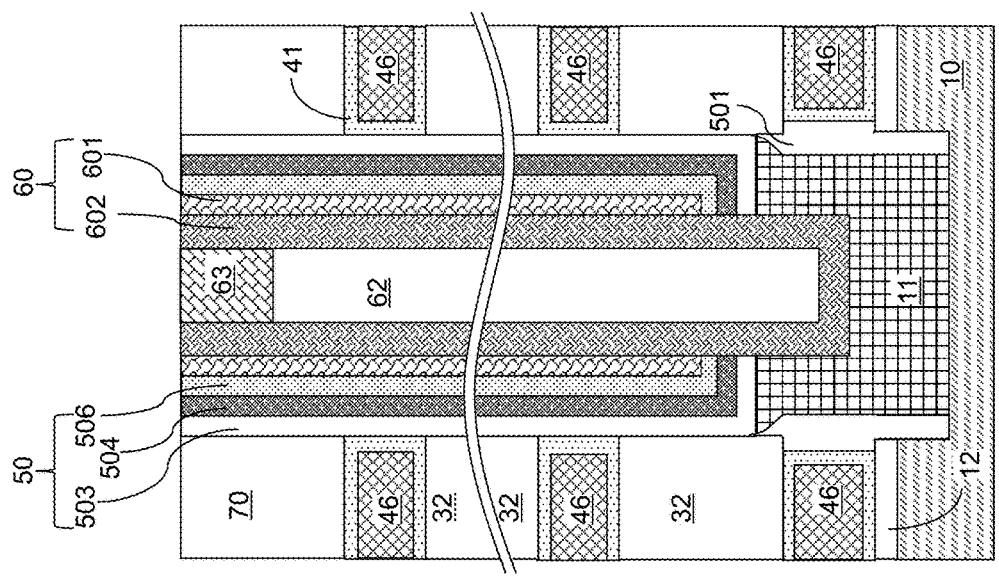
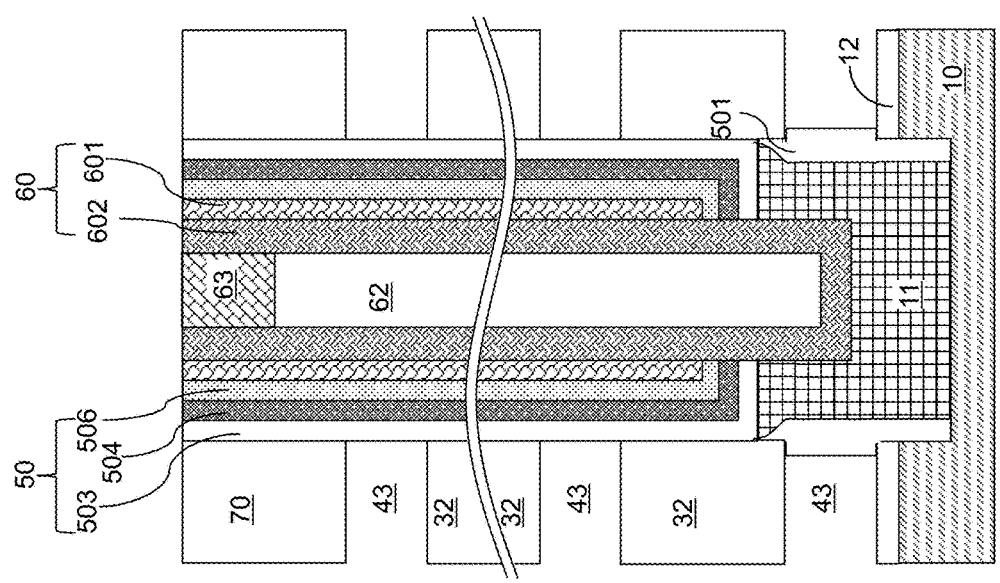

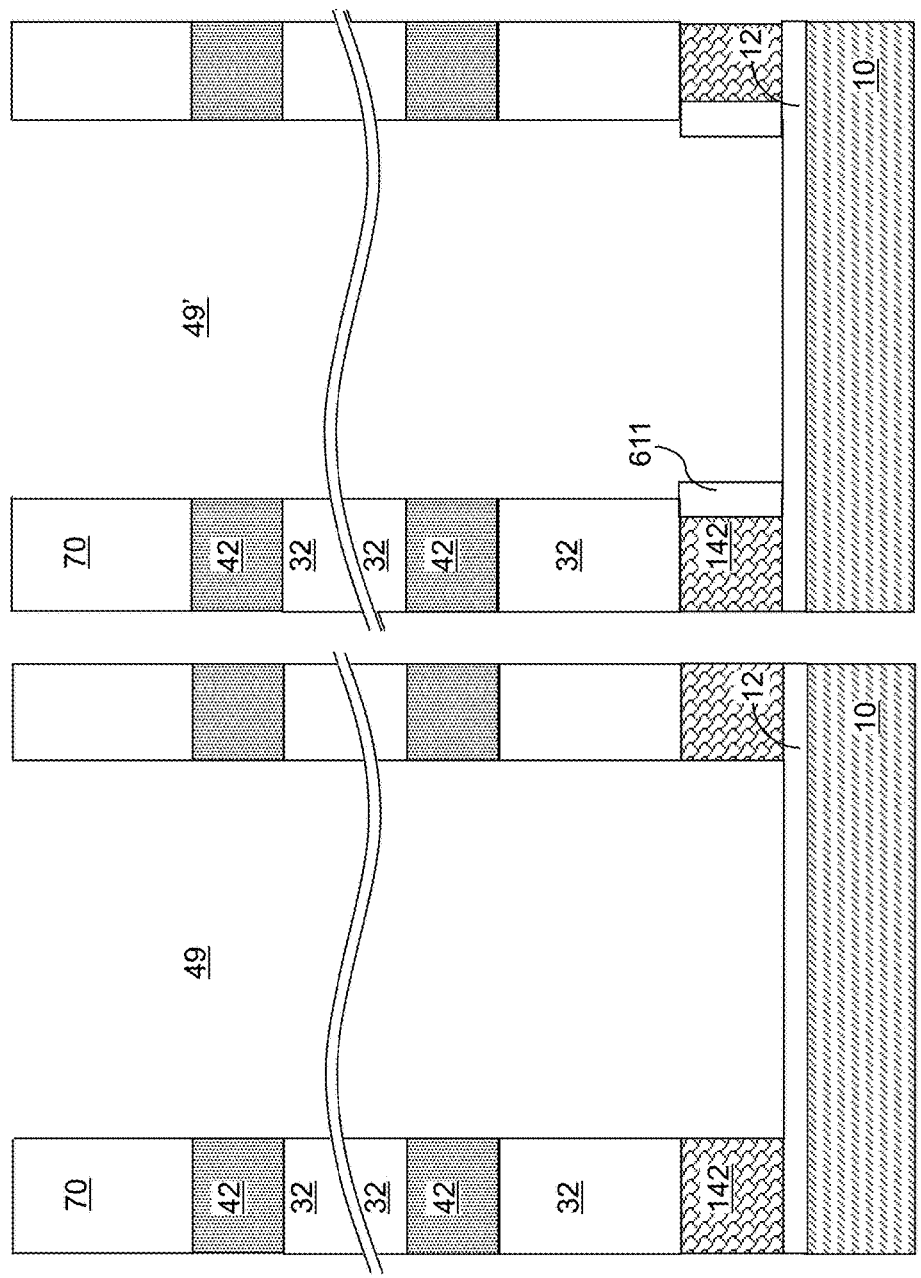

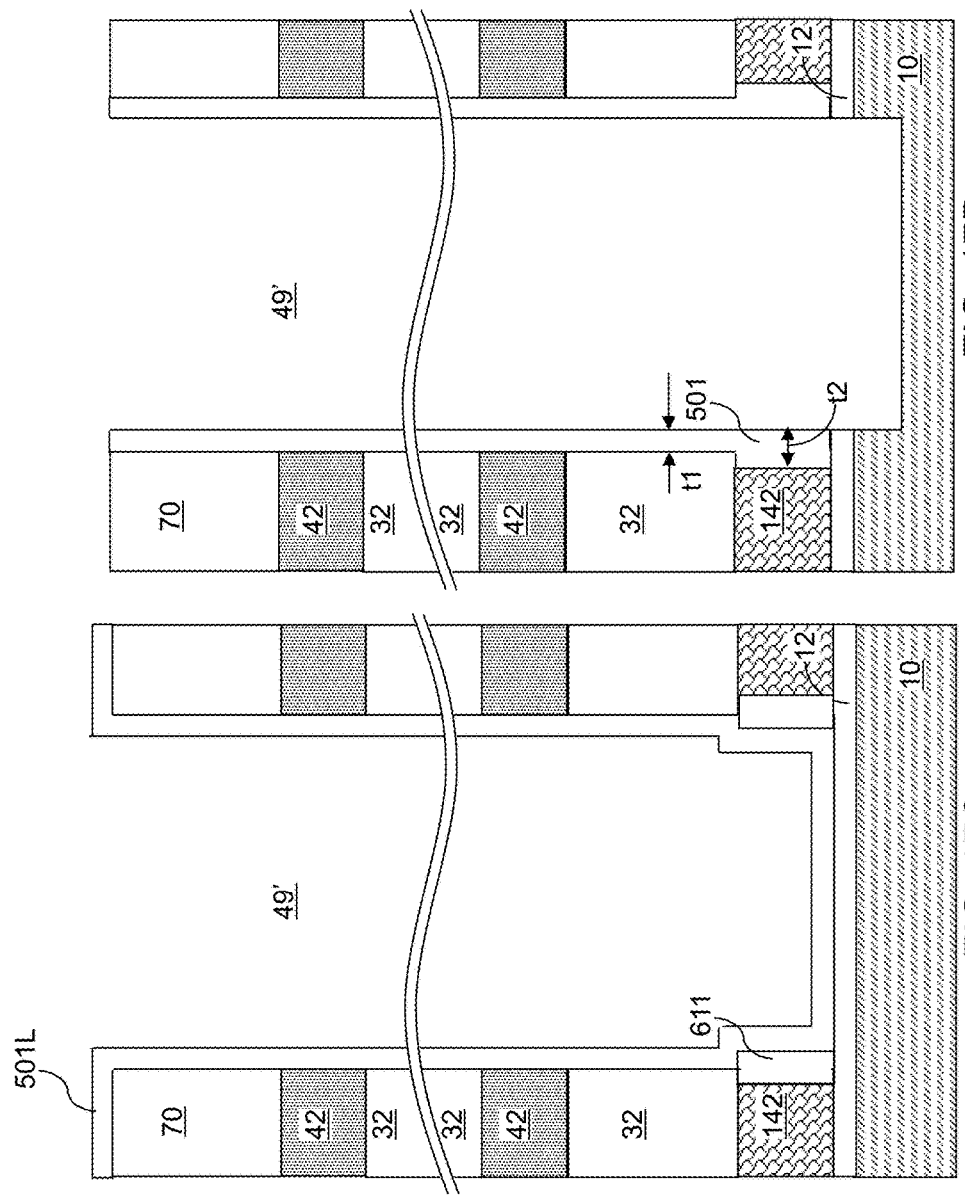

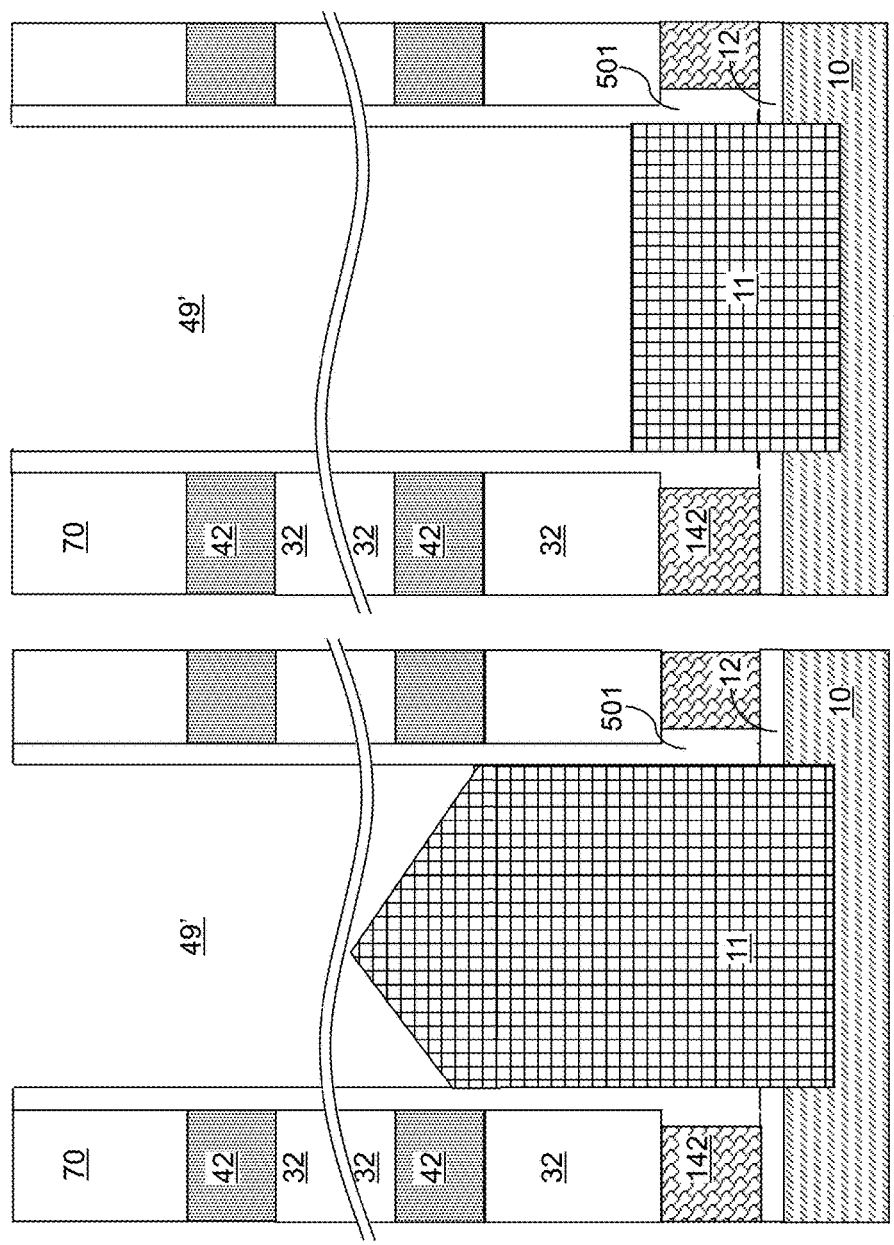

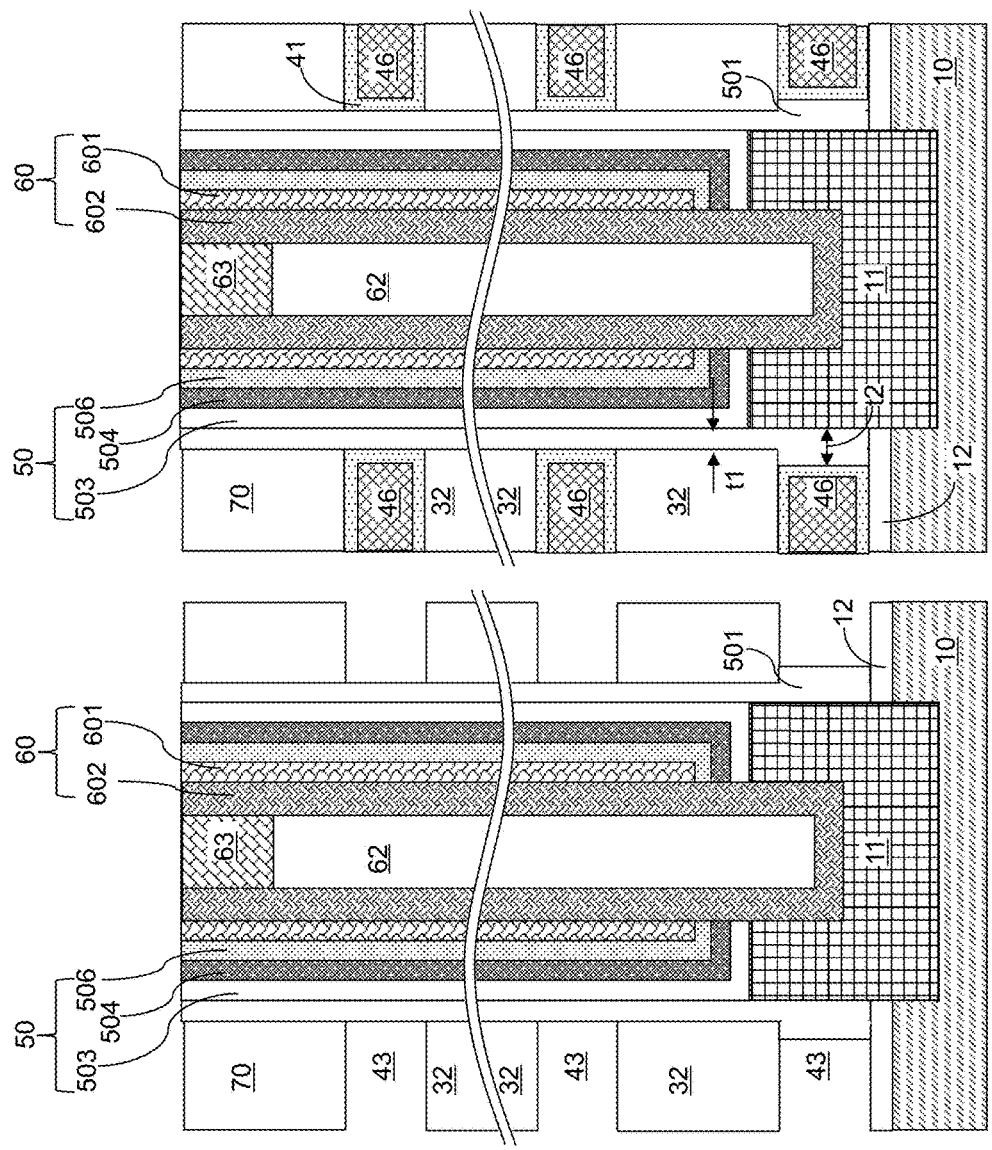

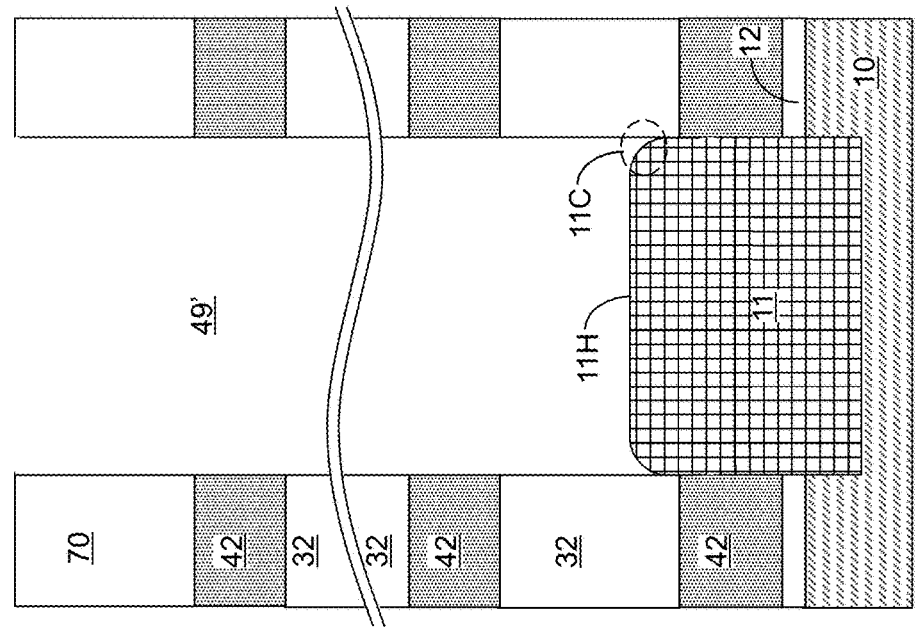
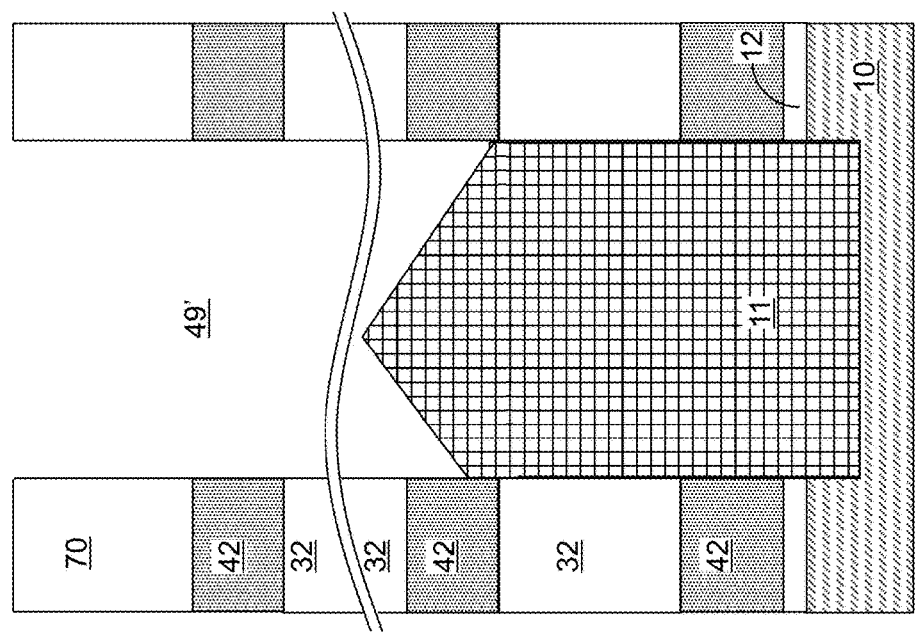

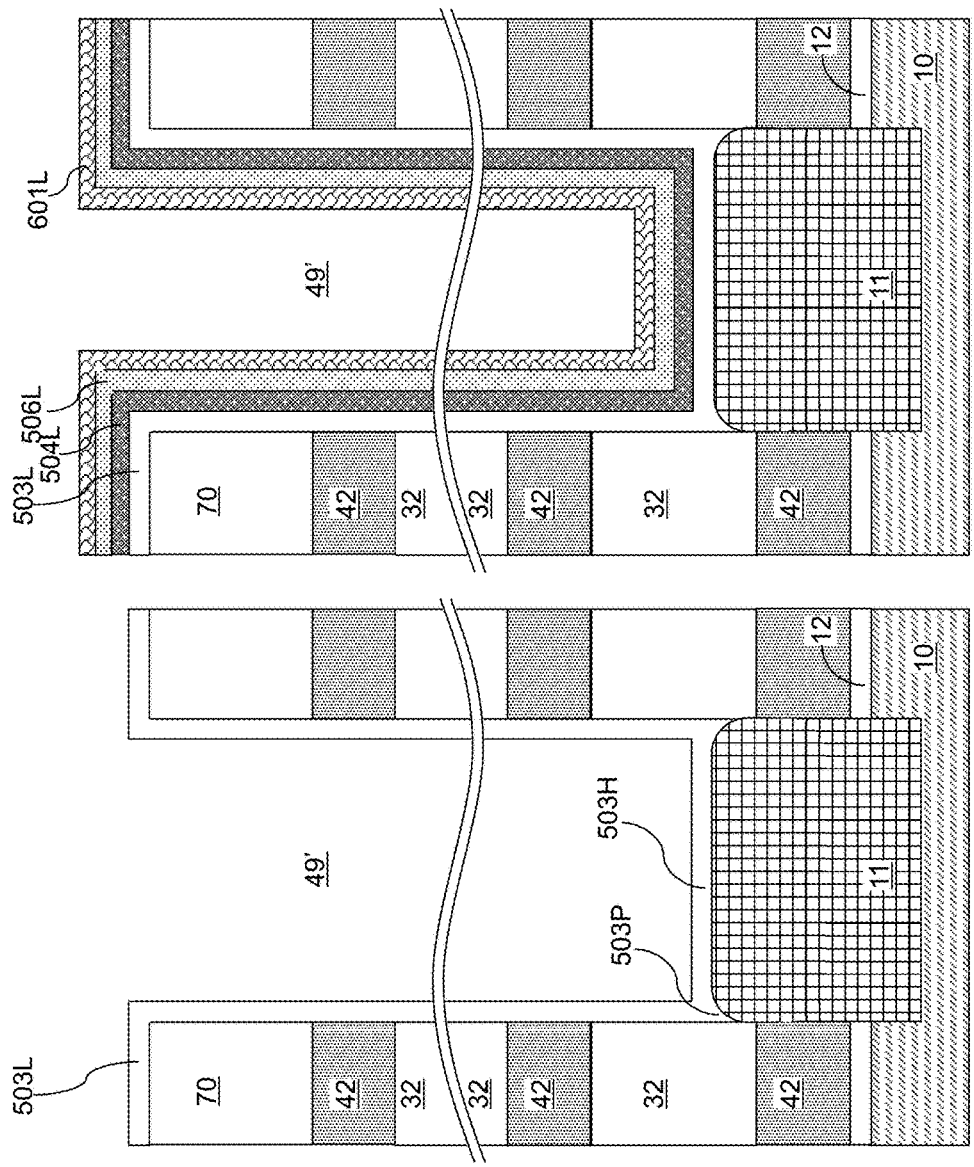

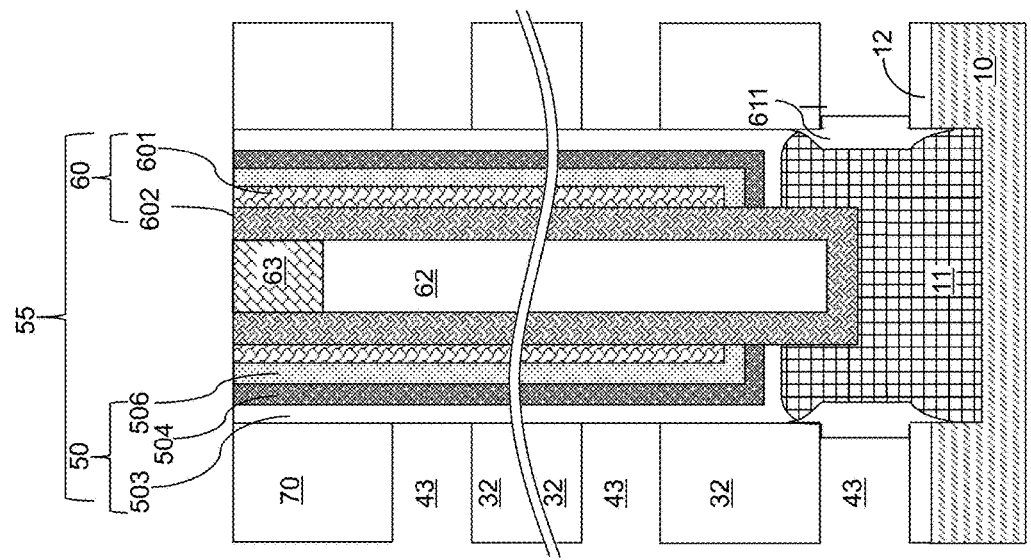
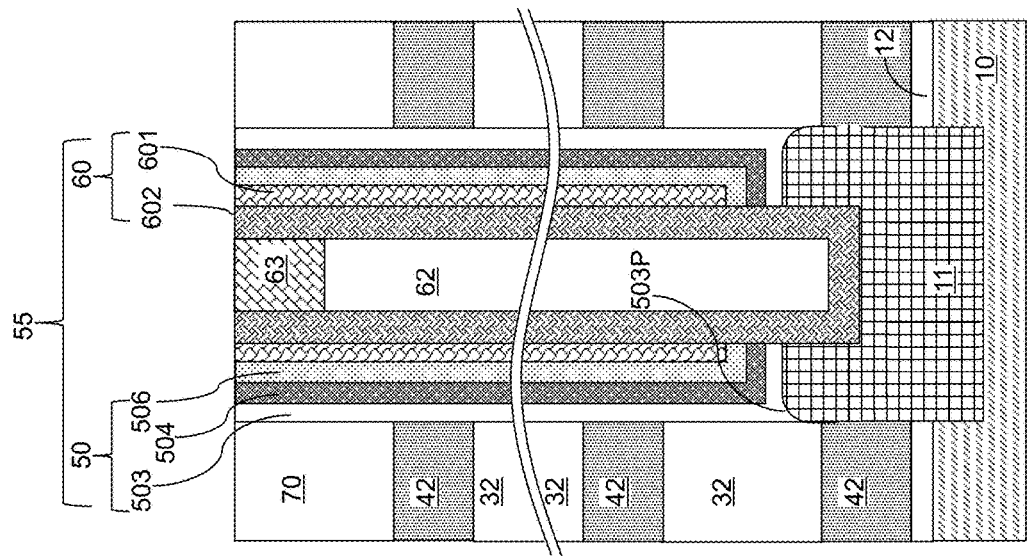

THREE-DIMENSIONAL MEMORY DEVICES HAVING A SHAPED EPITAXIAL CHANNEL PORTION

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36. An epitaxial channel portion can be employed as a portion of a channel for a vertical NAND string controlled by one or more select gate electrodes. Deformation of the epitaxial channel portion during a manufacturing process step can degrade performance of the memory device. Thus, a properly shaped epitaxial channel portion and a method of forming the same are desired.

SUMMARY

According to an aspect of the present disclosure, a three-dimensional memory device is provided, which comprises an alternating stack of insulating layers and electrically conductive layers located over a substrate; a memory opening extending through the alternating stack; an epitaxial channel portion located at a bottom of the memory opening and contacting a portion of the substrate; a memory stack structure overlying the epitaxial channel portion and located in the memory opening; and a dielectric collar structure laterally surrounding at least the epitaxial channel portion and having a first thickness region having a first thickness and a second thickness region having a second thickness that is greater than the first thickness. The second thickness region is located at a level of one of the electrically conductive layers and contacting an outer sidewall of the epitaxial channel portion.

According to another aspect of the present disclosure, a method of manufacturing a device is provided. An alternating stack comprising insulating layers and spacer material layers is formed over a substrate. A memory opening is formed through the alternating stack. A dielectric collar structure is formed at a periphery of the memory opening at least by forming and anisotropically etching a conformal dielectric material layer. An epitaxial channel portion is formed on a semiconductor surface underneath the memory opening and within the dielectric collar structure. A memory stack structure is formed over the epitaxial channel portion and within the memory opening.

According to yet another aspect of the present disclosure, a method of manufacturing a device is provided. An alternating stack comprising insulating layers and spacer material layers is formed over a substrate. A memory opening is formed through the alternating stack. An epitaxial channel portion is formed on a semiconductor surface underneath the memory opening. The epitaxial channel portion includes at least one crystallographic facet that is at an angle with respect to a horizontal plane. An upper portion of the epitaxial channel portion is recessed employing a recess etch process. An upper portion of the epitaxial channel portion is removed. A total physically exposed area of a remaining portion of the epitaxial channel portion is less than a total physically exposed area of the epitaxial channel portion prior to removal of the upper portion. A memory stack structure is formed on a remaining portion of the epitaxial channel portion.

According to even another aspect of the present disclosure, a three-dimensional memory device is provided, which comprises an alternating stack of insulating layers and electrically conductive layers located over a substrate; a memory opening extending through the alternating stack; an epitaxial channel portion located at a bottom of the memory opening and contacting a portion of the substrate, wherein the epitaxial channel portion comprises a chamfer; and a memory stack structure overlying the epitaxial channel portion and located in the memory opening.

According to still another aspect of the present disclosure, a method of manufacturing a device is provided. An alternating stack comprising insulating layers and spacer material layers is formed over a substrate. A memory opening is formed through the alternating stack. An epitaxial channel portion is formed on a semiconductor surface underneath the memory opening. An upper portion of the epitaxial channel portion is removed. A remaining portion of the epitaxial channel portion comprises a chamfer. A memory stack structure is formed on the remaining portion of the epitaxial channel portion.

BRIEF DESCRIPTION OF THE DRAWINGS

FIGS. 2A-2K are sequential vertical cross-sectional views of a region around a memory opening within the first exemplary structure during various processing steps employed to form a memory stack structure according to the first embodiment of the present disclosure.

FIG. 6B is a magnified view of a region of a region around a memory opening of the first exemplary structure of FIG. 6A.

FIGS. 11A-11D are sequential vertical cross-sectional views of a region around a memory opening within a second exemplary structure during various processing steps employed to form a memory stack structure according to a second embodiment of the present disclosure.

FIG. 12A-12E are sequential vertical cross-sectional view of a region around a memory opening within a third exemplary structure during various processing steps employed to form a memory stack structure according to a third embodiment of the present disclosure.

FIG. 12F is a vertical cross-sectional view of a region around a memory opening after removal of the sacrificial material layers according to the third embodiment of the present disclosure.

FIGS. 13A and 13B are sequential vertical cross-sectional views of a region around a memory opening within an alternate embodiment of the third exemplary structure during processing steps employed to form an epitaxial channel portion according to the third embodiment of the present disclosure.

FIGS. 15A-15H are sequential vertical cross-sectional views of a region around a memory opening within the fourth exemplary structure during various processing steps employed to form a memory stack structure according to the fourth embodiment of the present disclosure.

FIGS. 16A and 16B are sequential vertical cross-sectional views of a region around a memory opening during replacement of the sacrificial material layers with electrically conductive layers according to the fourth embodiment of the present disclosure.

FIGS. 17A-17G are sequential vertical cross-sectional views of a region around a memory opening within a fifth exemplary structure during various processing steps employed to form a memory stack structure according to a fifth embodiment of the present disclosure.

FIGS. 18A and 18B are sequential vertical cross-sectional views of a region around a memory opening during replacement of the sacrificial material layers with electrically conductive layers according to the fifth embodiment of the present disclosure.

FIGS. 19A-19F are sequential vertical cross-sectional views of a region around a memory opening within a sixth exemplary structure during various processing steps employed to form a memory stack structure according to a sixth embodiment of the present disclosure.

DETAILED DESCRIPTION

Figure 1:
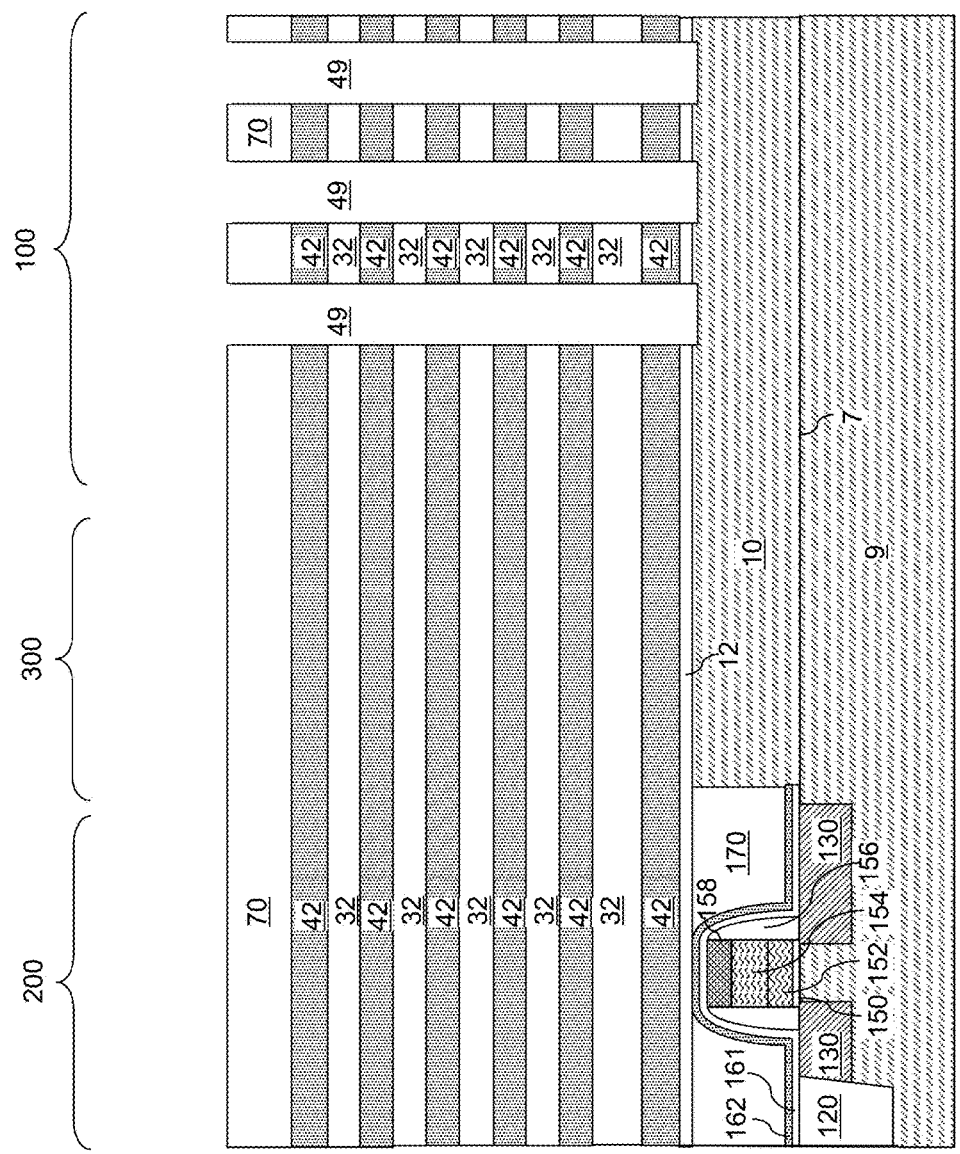
FIG. 1 is a vertical cross-sectional view of a first exemplary structure after formation of an alternating stack of insulating layers and sacrificial material layers and memory openings extending through the alternating stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. Disclosure of an embodiment in which a first element comprises a second element herein also discloses another embodiment in which the first element consists essentially of, or consists of, the second element except for cases in which presence of an additional element is inherently implied.

As used herein, a "layer" refers to a material portion including a region having a thickness, such as a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which may include a semiconductor substrate (e.g., a single crystalline silicon wafer). The substrate can include a substrate semiconductor layer 9 including a top surface 7, which is herein referred to as a major surface of the substrate (as opposed to a minor surface having a lesser area such as a sidewall surface of the substrate semiconductor layer 9). The substrate semiconductor layer 9 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art. An optional semiconductor well layer 10 may be formed over the substrate semiconductor layer 9.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The semiconductor well layer 10 can include at least one doped well (not expressly shown) having a substantially uniform dopant concentration therein.

The first exemplary structure can have multiple regions for building different types of devices. Such areas can include, for example, a device region 100, a contact region 300, and a peripheral device region 200. At least one semiconductor device for a peripheral circuitry can be formed on a portion of the substrate semiconductor layer 9. The at least one semiconductor device can include, for example, field effect transistors that are formed in the peripheral device region 200. Optionally, a portion of the substrate semiconductor layer 9 in the peripheral device region may be recessed by a masked recess etch, or may be raised by a selective epitaxy process that employs a dielectric hard mask that covers other regions, prior to formation of the at least one semiconductor device therein.

Optionally, shallow trench isolation structures 120 may be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor well layer 10 can be formed on the top surface of the substrate semiconductor layer 9 by deposition of a single crystalline semiconductor material, for example, by selective epitaxy. Alternatively, the optional semiconductor well layer 10 may be formed by implantation of electrical dopants (p-type dopants or n-type dopants) into at least one upper portion of the substrate semiconductor layer 9. In case the optional semiconductor well layer 10 is not formed, the substrate semiconductor layer 9 can extend to the top surface of the substrate. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor well layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor well layer 10 can have a top surface that is coplanar with the top surface of the planarization dielectric layer 170.

In one embodiment, the semiconductor well layer 10 can include at least one doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor well layer 10 or can be a portion of the semiconductor well layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0\times10^{15}/cm^3$ to $1.0\times10^{18}/cm^3$, although lesser and greater dopant concentration levels can also be employed. As used herein, a dopant concentration level refers to average dopant concentration for a given region.

Optionally, a gate dielectric layer 12 can be formed above the semiconductor well layer 10. The gate dielectric layer 12 can be employed as the gate dielectric for a first source select gate electrode. The gate dielectric layer 12 can include, for example, silicon oxide and/or a dielectric metal oxide (such as $HfO_2$, $ZrO_2$, $LaO_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer, which is a material layer that provides vertical spacing between a neighboring pair of insulating layers 32. In one embodiment, each first material layer can be an insulating layer 32, and each second material layer can be a sacrificial material layer 42. In other words, the spacer material layers may be sacrificial material layers 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein. Alternatively, the spacer material layers may be formed as electrically conductive layers. In this case, replacement of the spacer material layers with different electrically conductive layers in a subsequent processing step may not be necessary.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, silicon oxynitride, and a dielectric metal oxide.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the first exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor well layer 10. A semiconductor surface of the substrate (9, 10) is physically exposed at the bottom of each memory opening 49. The recess depth of the bottom surface of each memory opening 49 with respect to the top surface of the semiconductor well layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, a dielectric collar structure 501 is formed within each memory opening 49 by forming a conformal dielectric material layer and anisotropically etching horizontal portions of the conformal dielectric material layer. Specifically, the conformal dielectric material layer can be formed on the surfaces of each memory opening 49 and over the insulating cap layer 70. The conformal dielectric material layer includes a dielectric material that can be employed as a blocking dielectric, i.e., a dielectric that electrically isolates a memory element (e.g., charge storage region) from a control gate electrode, or as a gate dielectric of a select gate transistor. For example, the conformal dielectric material layer can include a dielectric material such as silicon oxide, silicon oxynitride, silicon nitride, and/or a dielectric metal oxide (e.g., aluminum oxide). In one embodiment, the conformal dielectric material layer can include silicon oxide. In one embodiment, the conformal dielectric material layer can be formed by deposition of a dielectric material employing a conformal deposition method such as chemical vapor deposition (CVD) or atomic layer deposition (ALD). For example, a conformal silicon oxide layer can be formed by decomposition of a silicon oxide precursor such as tetraethylorthosilicate (TEOS) in a chemical vapor deposition process. Alternatively or additionally, the conformal dielectric material layer can be deposited by deposition of a semiconductor material layer (e.g., amorphous silicon or polysilicon) employing a conformal deposition method (such as CVD), and by converting the semiconductor material layer into a conformal dielectric material (e.g., silicon nitride or silicon oxide) layer by thermal oxidation, plasma oxidation, thermal nitridation, and/or plasma nitridation. In an illustrative example, an amorphous silicon layer may be deposited employing a CVD process, and can be subsequently converted into a silicon oxide layer by thermal oxidation or plasma oxidation. The thickness of the conformal dielectric material layer can be in a range from 1 nm to 10 nm, although lesser and greater thicknesses can also be employed.

An anisotropic etch is performed on the conformal dielectric material layer to remove horizontal portions of the conformal dielectric material layer that are located over the insulating cap layer 70 and at the bottom of each memory opening 49. The anisotropic etch may, or may not, be selective to the underlying semiconductor material underneath the memory opening 49. A dielectric collar structure 501 including vertical portions of the conformal dielectric material layer is formed at the periphery of each memory opening 49. A semiconductor surface is physically exposed underneath a cavity 49' that is present within the dielectric collar portion 501. The dielectric collar structure 501 can be formed on a sidewall surface and a top surface of a recessed region in the substrate (9, 10), which may be, for example, a sidewall surface and a recessed top surface of the semiconductor well layer 10. In one embodiment, each dielectric collar structure 501 can vertically extend from the bottom surface of the memory opening 49 at least to the topmost layer of the alternating stack (32, 42) upon formation, which may be the topmost insulating layer 32 or the topmost sacrificial material layer 42. In one embodiment the dielectric collar structure 501 can cover the sidewall of the insulating cap layer 70 around the memory opening 49. The dielectric collar structure 501 can be homeomorphic to a torus, to a torus, i.e., generally ring-shaped. As used herein, an element is topologically homeomorphic to a torus if the shape of the element can be continuously stretched without destroying a hole or forming a new hole into the shape of a torus.

Referring to FIG. 2C, an epitaxial channel portion 11 can be formed at the bottom of each memory opening 49 by selective epitaxy of a semiconductor material after forming the dielectric collar structure 501. During the selective epitaxy process, a reactant gas and an etchant gas can be simultaneously or alternatively flowed into a process chamber. Semiconductor surfaces and dielectric surfaces of the first exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor well layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor well layer 10. Each epitaxial channel portion 11 functions as a portion of a channel of a vertical field effect transistor. In one embodiment, the top surface of the epitaxial channel portion 11 may be between a pair of sacrificial material layers 42. In this case, a periphery of each epitaxial channel portion 11 can be in physical contact with a sidewall of an insulating layer 32. A cavity 49' is present over an epitaxial channel portion 11 in each memory opening 49.

Referring to FIG. 2D, physically exposed portions of the dielectric collar structure 501 can be removed from above a horizontal plane including the top surface of the epitaxial channel portion 11. The epitaxial channel portion 11 can function as a blocking structure for the etchant employed during the etch process that removes the physically exposed portions of the dielectric collar structure 501. Thus, the height of the remaining portion of the dielectric collar structure 501 can be self-aligned to the height of the epitaxial channel portion 11. In an illustrative example, if the dielectric collar structure 501 includes silicon oxide, a wet etch process employing dilute hydrofluoric acid can be employed to remove the physically exposed portions of the dielectric collar portion 501. The etchant of etch process employed to remove the physically exposed portions of the dielectric collar structure 501 may, or may not, be selective to the material of the alternating stack (32, 42). In one embodiment, the etch process can be controlled to minimize collateral etching of the alternating stack (32, 42).

Figure 2F:
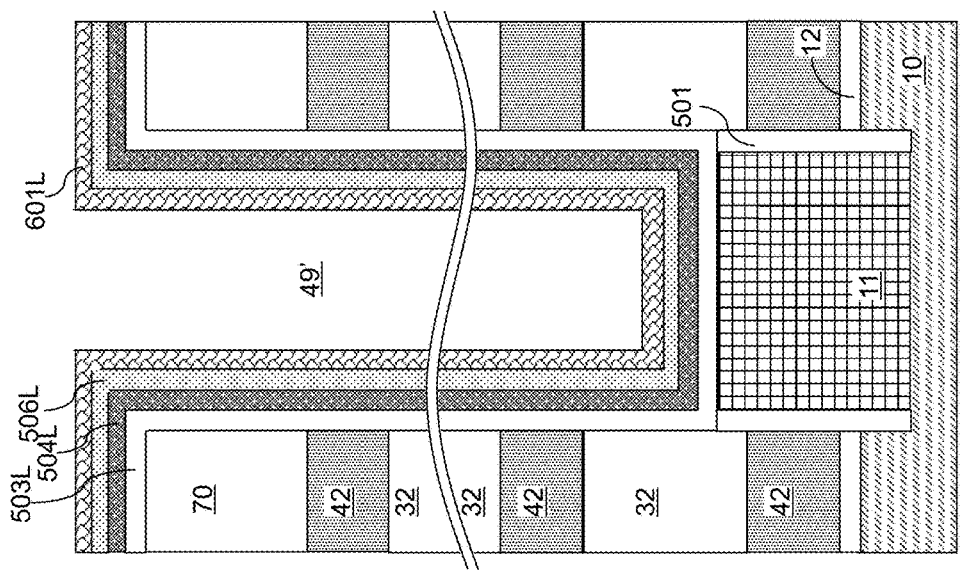
Figure 2E:
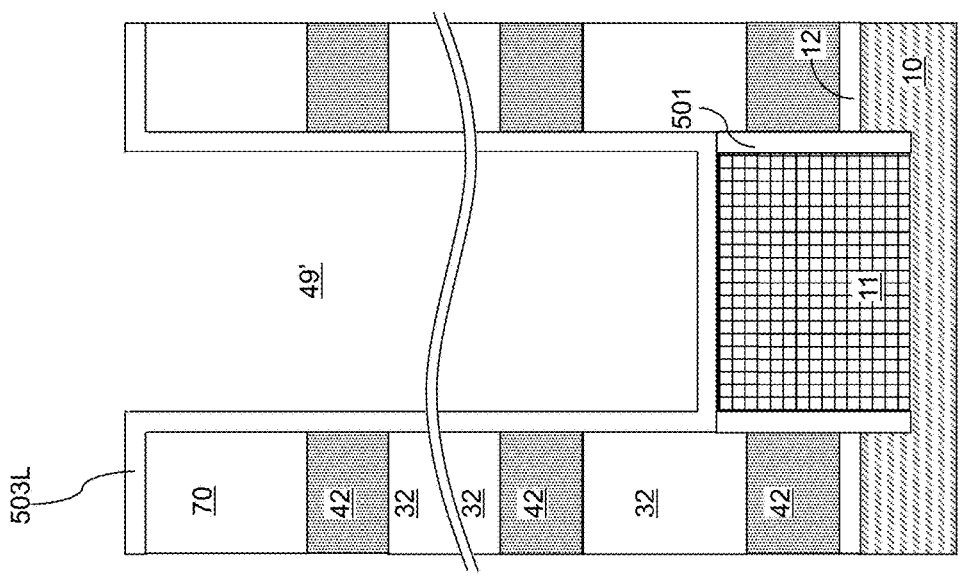

Referring to FIG. 2E, a blocking dielectric layer 503L can be formed as a conformal dielectric material layer. The blocking dielectric layer 503L can be formed on the physically exposed sidewall of each memory opening and on the top surface of each epitaxial channel portion 11. The blocking dielectric layer 503L includes at least one dielectric material, which can include silicon oxide, a dielectric metal oxide, silicon oxynitride, silicon nitride, or a combination thereof. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide can be deposited, for example, by chemical vapor deposition (CVD), atomic layer deposition (ALD), pulsed laser deposition (PLD), liquid source misted chemical deposition, or a combination thereof.

In one embodiment, the blocking dielectric layer 503L can include silicon oxide, aluminum oxide, or a stack thereof. The blocking dielectric layer 503L can be formed by at least one conformal deposition method such as low pressure chemical vapor deposition, atomic layer deposition, or a combination thereof. The thickness of the blocking dielectric layer 503L can be in a range from 1 nm to 20 nm, although lesser and greater thicknesses can also be employed.

Referring to FIG. 2F, a series of layers including a continuous memory material layer 504L, a tunneling dielectric layer 506L, and an optional first semiconductor channel layer 601L can be sequentially deposited in the memory openings 49. In one embodiment, the continuous memory material layer 504L can be a charge trapping material including a dielectric charge trapping material, which can be, for example, silicon nitride. Alternatively, the continuous memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504L includes a silicon nitride layer.

The continuous memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504L may comprise an insulating charge trapping material, such as one or more silicon nitride segments. Alternatively, the continuous memory material layer 504L may comprise conductive nanoparticles such as metal nanoparticles, which can be, for example, ruthenium nanoparticles. The continuous memory material layer 504L can be formed, for example, by chemical vapor deposition (CVD), atomic layer deposition (ALD), physical vapor deposition (PVD), or any suitable deposition technique for storing electrical charges therein. The thickness of the continuous memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (503L, 504L, 506L, 601L).

Referring to FIG. 2G, the optional first semiconductor channel layer 601L, the tunneling dielectric layer 506L, the continuous memory material layer 504L, the blocking dielectric layer 503L are sequentially anisotropically etched employing at least one anisotropic etch process. The portions of the first semiconductor channel layer 601L, the tunneling dielectric layer 506L, the continuous memory material layer 504L, and the blocking dielectric layer 503L located above the top surface of the insulating cap layer 70 can be removed by the at least one anisotropic etch process. Further, the horizontal portions of the first semiconductor channel layer 601L, the tunneling dielectric layer 506L, the continuous memory material layer 504L, and the blocking dielectric layer 503L at a bottom of each cavity 49' can be removed to form openings in remaining portions thereof. Each of the first semiconductor channel layer 601L, the tunneling dielectric layer 506L, the continuous memory material layer 504L, and the blocking dielectric layer 503L can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504L is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the blocking dielectric layer 503L is herein referred to as a blocking dielectric 503.

Figure 3:
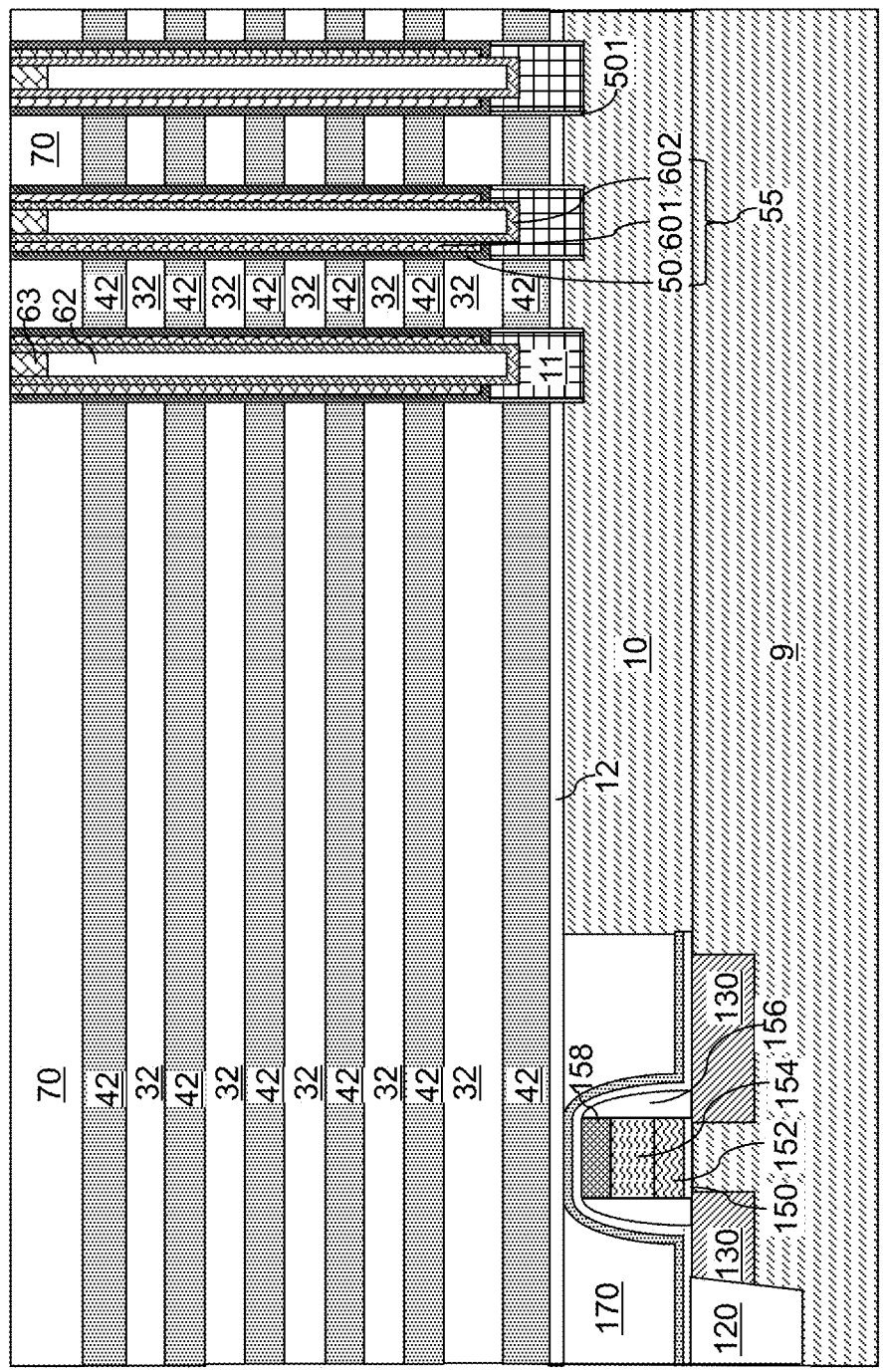
FIG. 3 is a vertical cross-sectional view of the first exemplary structure after formation of memory stack structures according to the first embodiment of the present disclosure.

A surface of the epitaxial channel portion 11 can be physically exposed underneath the opening through the first semiconductor channel portion 601, the tunneling dielectric 506, the memory material layer 504, and the blocking dielectric 503. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 by a recess distance. A tunneling dielectric 506 is located over the memory material layer 504. A set of blocking dielectric 503, a memory material layer 504, and a tunneling dielectric 506 in a memory opening 49 constitutes a memory film 50, which includes a plurality of charge storage regions (as embodied as the memory material layer 504) that are insulated from surrounding materials by the blocking dielectric 503 and the tunneling dielectric 506. A blocking dielectric 503 can be the outer layer of each memory film 50 and thus of the memory stack structure 55 which is shown in FIG. 3.

In one embodiment, the first semiconductor channel portion 601, the tunneling dielectric 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2H, a second semiconductor channel layer 602L can be deposited directly on the semiconductor surface of the epitaxial channel portion 11 and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 2I:
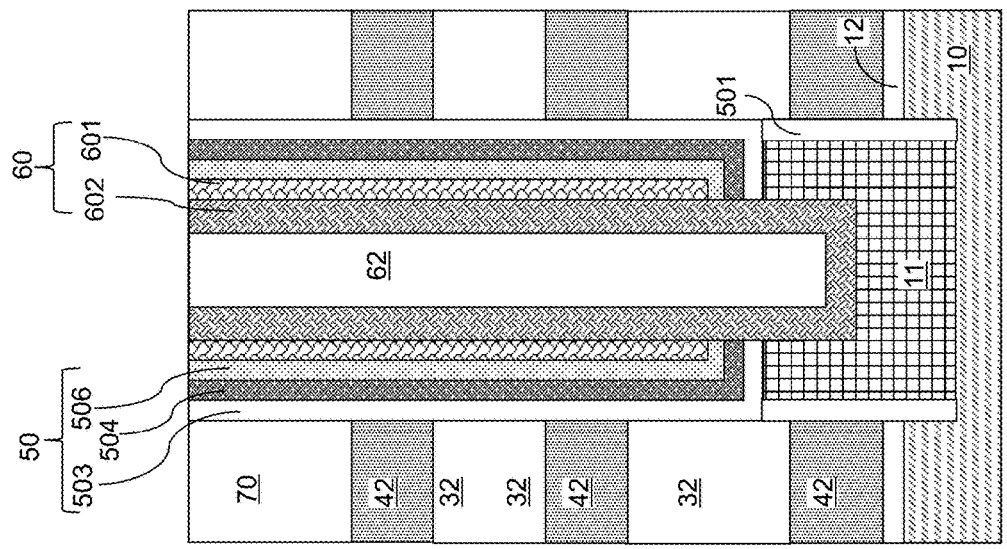

Referring to FIG. 2I, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2J:
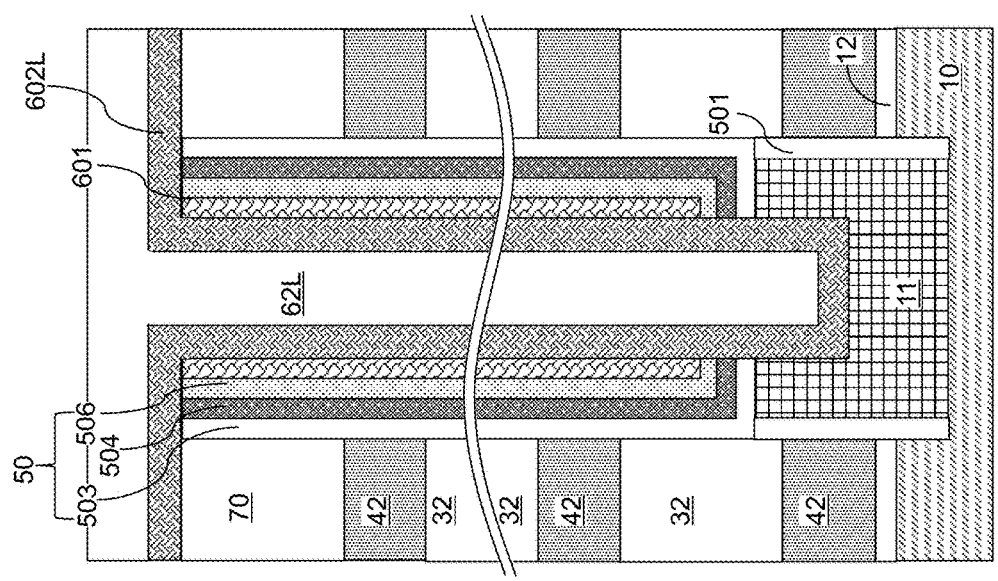

Referring to FIG. 2J, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is surrounded by memory material layer 504, and laterally surrounds a portion of the semiconductor channel 60. Each adjoining set of a first blocking dielectric 501, a second blocking dielectric 503, a memory material layer 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2K, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

The exemplary memory stack structure 55 can be embedded into the first exemplary structure illustrated in FIG. 1. FIG. 3 illustrates the first exemplary structure that incorporates multiple instances of the exemplary memory stack structure of FIG. 2K. Each exemplary memory stack structure 55 includes a semiconductor channel 60 which may include layers 601 and 602, a tunneling dielectric layer 506 laterally surrounding the semiconductor channel 60, and a vertical stack of charge storage regions laterally surrounding the tunneling dielectric 506 (as embodied as a memory material layer 504). The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor well layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures.

Figure 4:
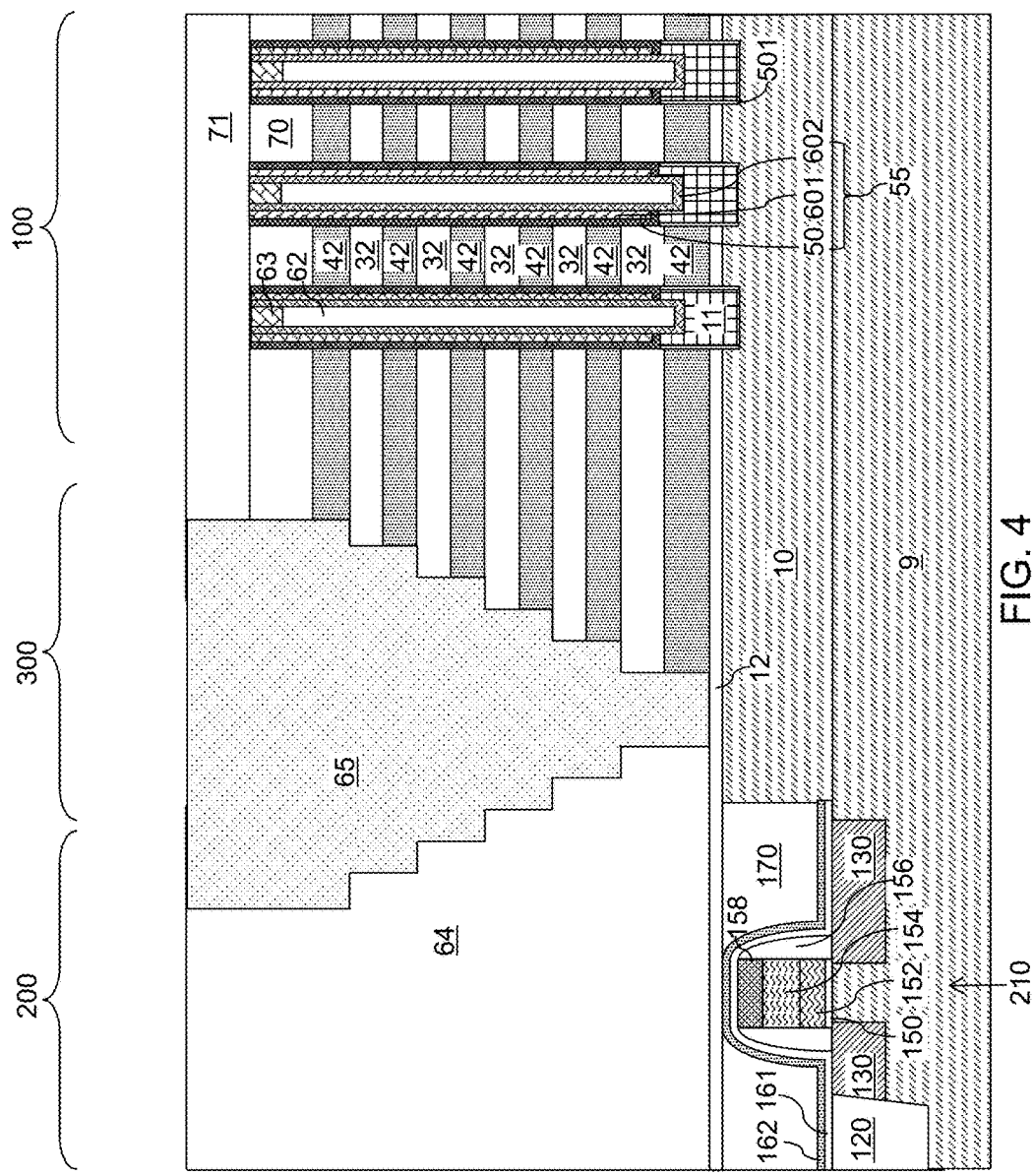
FIG. 4 is a vertical cross-sectional view of the first exemplary structure after formation of a set of stepped surfaces and a retro-stepped dielectric material portion according to the first embodiment of the present disclosure.

Referring to FIG. 4, an optional first contact level dielectric layer 71 can be formed over the semiconductor well layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor well layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor well layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 5A:
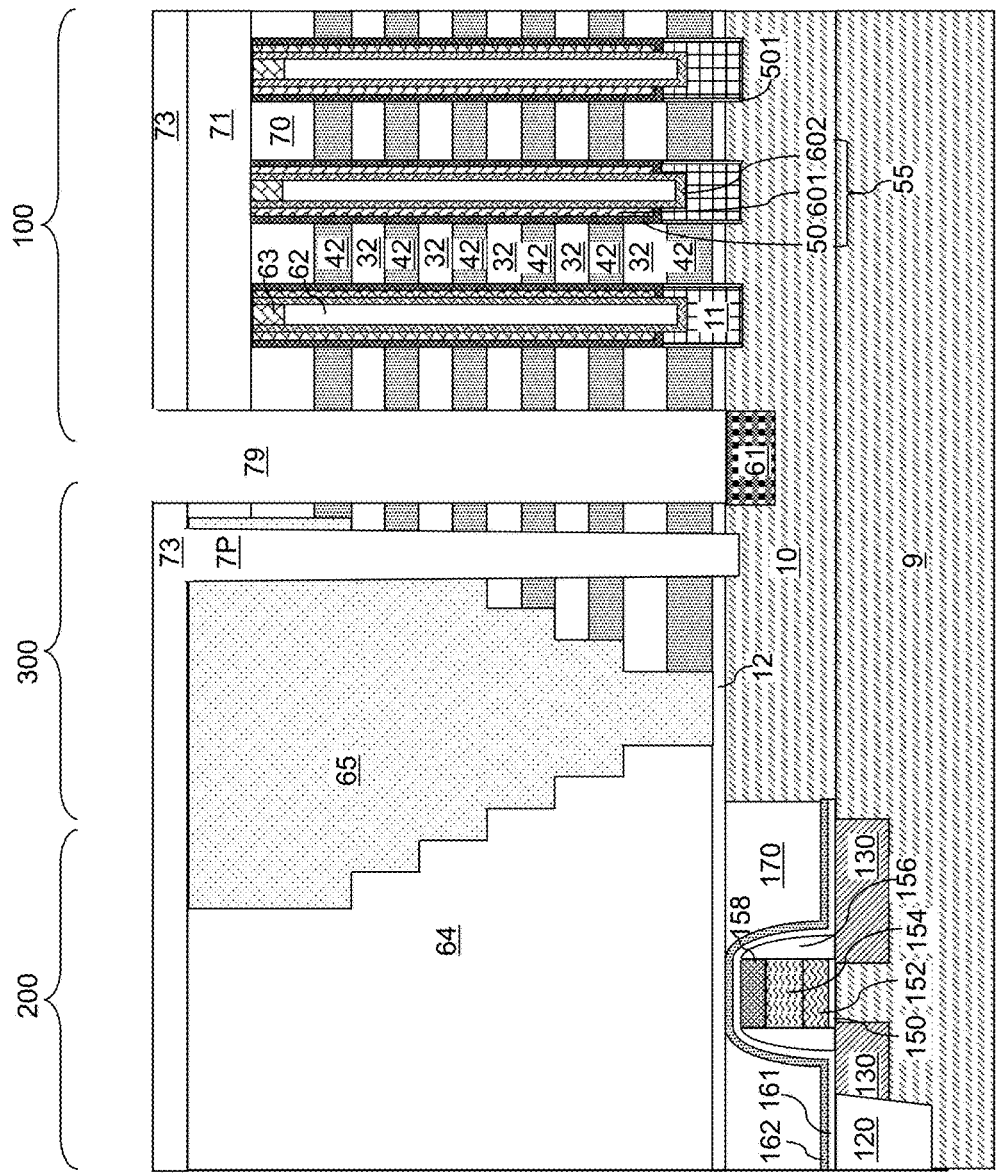
FIG. 5A is a vertical cross-sectional view of the first exemplary structure after formation of dielectric pillar structures and backside trenches according to the first embodiment of the present disclosure.
Figure 5B:
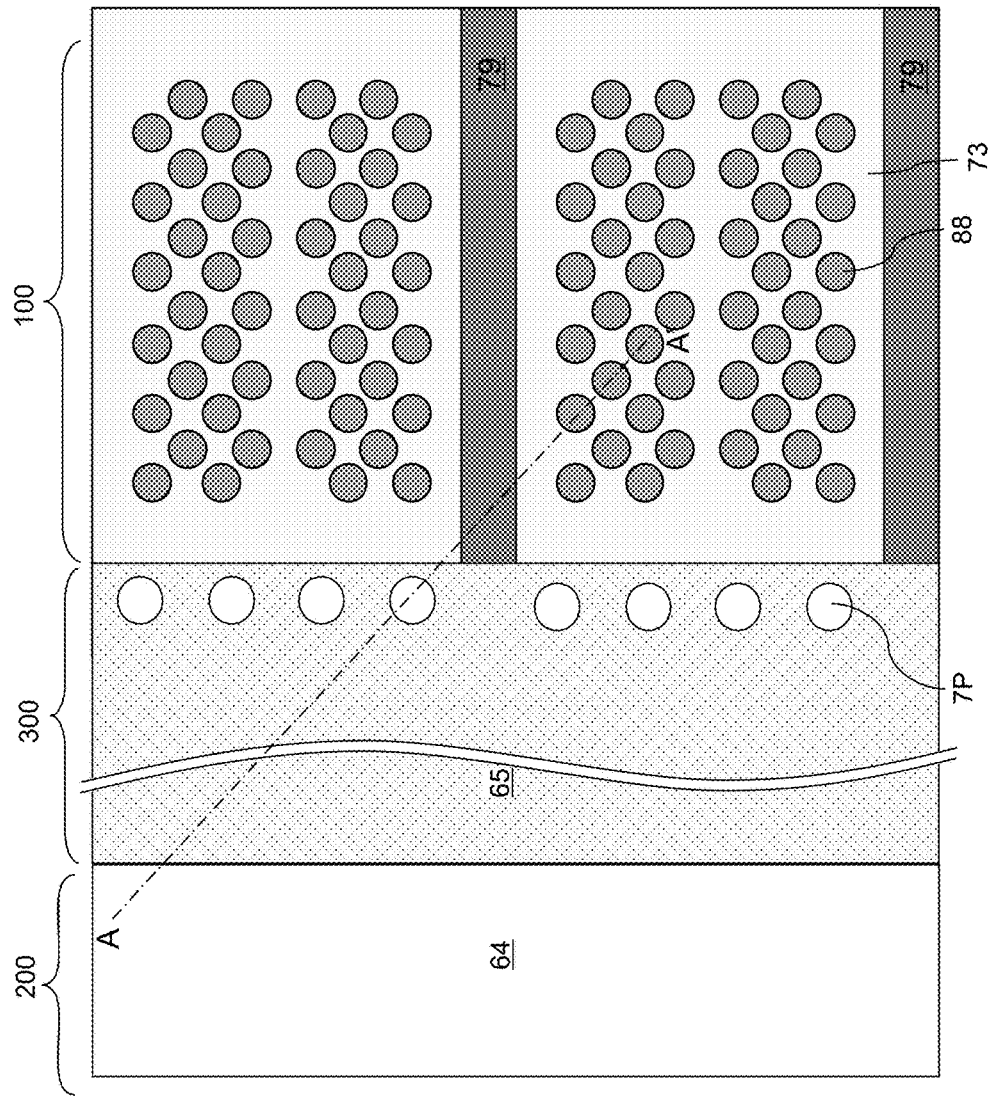
FIG. 5B is a see-through top-down view of the first exemplary structure of FIG. 5A. The vertical plane A-A' is the plane of the vertical cross-sectional view of FIG. 5A.

Referring to FIGS. 5A and 5B, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface 7 of the substrate semiconductor layer 9, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Trenches (which are herein referred to as backside trenches 79) can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). Each backside trench 79 extends through the in-process alternating stack (32, 42) and to the top surface of the substrate (9, 10). A top surface of the semiconductor well layer 10 can be physically exposed at the bottom of each backside trench 79. In one embodiment, each backside trench 79 can extend along a first horizontal direction so that clusters of the memory stack structures 55 are laterally spaced along a second horizontal direction that is different from the first horizontal direction. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor well layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

The alternating stack of insulating layers 32 and the sacrificial material layers 42 is an in-process structure, i.e., an in-process alternating stack. The in-process alternating stack is subsequently modified by replacement of the sacrificial material layers 42 with electrically conductive layers.

Figure 6A:
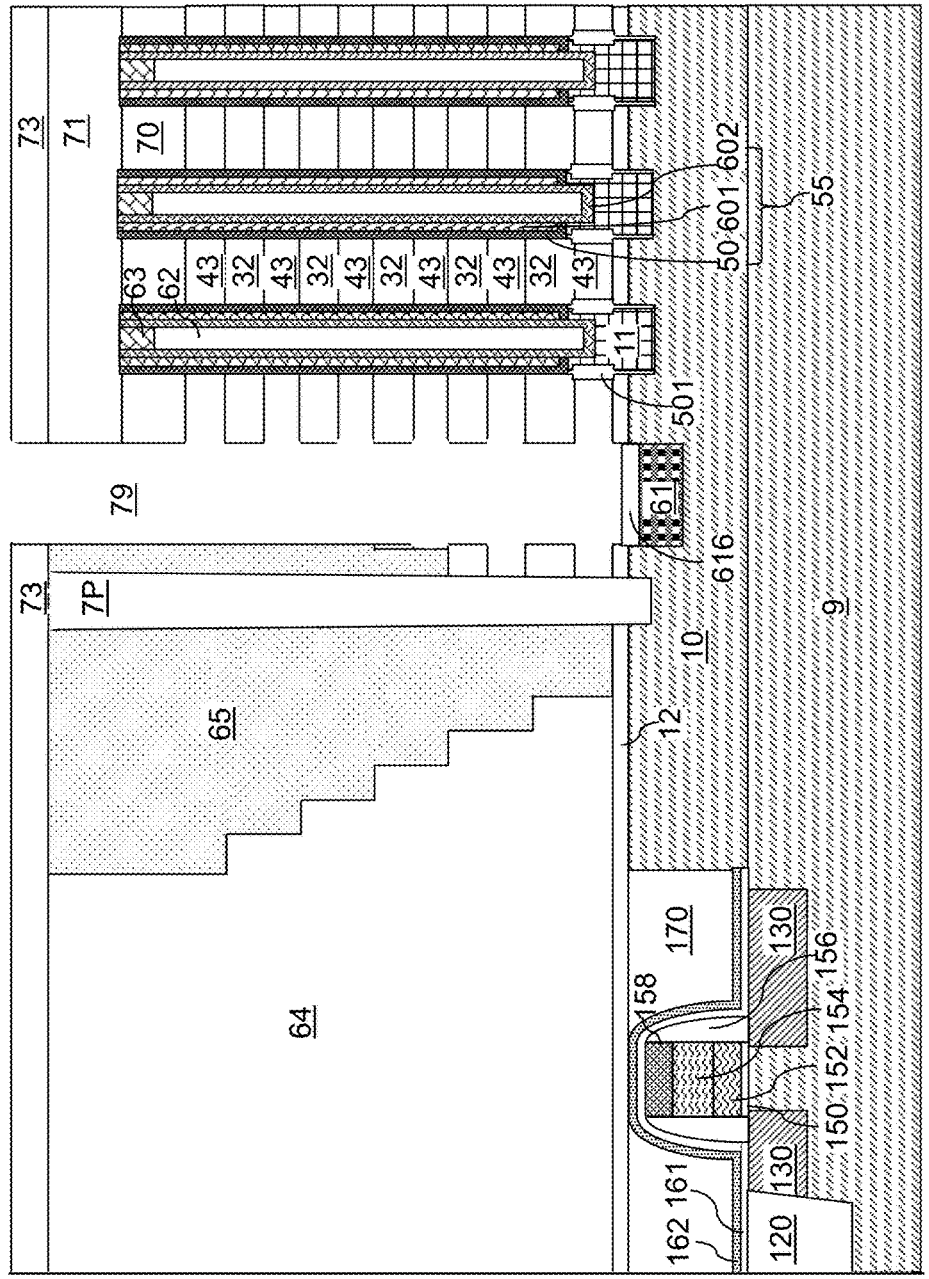
FIG. 6A is a vertical cross-sectional view of the first exemplary structure after formation of backside recesses according to the first embodiment of the present disclosure.

Referring to FIGS. 6A and 6B, an etchant that selectively etches the second material of the sacrificial material layers 42 with respect to the first material of the insulating layers 32 can be introduced through the backside trenches 79, for example, employing an etch process. Recesses (which are herein referred to as backside recesses 43) are formed in volumes from which the sacrificial material layers 42 are removed. The backside trenches 79 and the backside recesses 43 are formed from locations away from the memory stack structures 55, which are formed within memory openings 49 that are also referred to as front side openings.

The removal of the second material of the sacrificial material layers 42 can be selective to the dielectric material of the dielectric collar structures 501, the first material of the insulating layers 32, the material of the dielectric support pillars 7P, the material of the retro-stepped dielectric material portion 65, the semiconductor material of the semiconductor well layer 10, and the material of the outermost layer of the first memory films 50. In one embodiment, the sacrificial material layers 42 can include silicon nitride, and the materials of dielectric collar structures 501, the insulating layers 32, the dielectric support pillars 7P, and the retro-stepped dielectric material portion 65 can be selected from silicon oxide and dielectric metal oxides.

The etch process that removes the second material selective to the dielectric material of the dielectric collar structures 501, the first material of the insulating layers 32, and the outermost layer of the first memory films 50 (e.g., a blocking dielectric 503) can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side openings or holes in contrast with the backside recesses 43. In one embodiment, the device region 100 comprises an array of monolithic three-dimensional NAND strings having a plurality of device levels disposed above the substrate (e.g., above the semiconductor well layer 10). In this case, each backside recess 43 can define a space for receiving a respective word line of the array of monolithic three-dimensional NAND strings. A sidewall of each dielectric collar structure 501 can be physically exposed to a backside recess 43. The physically exposed portion of the sidewall of each dielectric collar structure can continuously encircle a respective epitaxial channel portion 11, and vertically extend from a bottom surface of a backside recess 43 to a top surface of the backside recess 43.

Each of the plurality of backside recesses 43 can extend substantially parallel to the top surface of the semiconductor well layer 10. A backside recess 43 can be vertically bounded by a top surface of an underlying insulating layer 32 and a bottom surface of an overlying insulating layer 32.

In one embodiment, each backside recess 43 can have a uniform height throughout. Optionally, a backside blocking dielectric layer can be formed in the backside recesses.

The thickness of a second region of each dielectric collar structure 501 located at the level of one or more lower backside recesses 43 (which may include the bottommost backside recess 43) can be selectively increased without increasing the thickness of a first region of the dielectric collar structure 501 that is located below, or above, the level of the backside recess(es) 43. For example, the first region can include the region of the dielectric collar structure 501 that contacts a sidewall of the semiconductor material of the substrate (9, 10), e.g., a sidewall of the semiconductor well layer 10 or sidewall of the insulating layer 32.

In one embodiment, a thermal oxidation process or a plasma oxidation process can be performed, and surface portions of the epitaxial channel portions 11 that are proximal to the backside recess 43 can be converted into a semiconductor oxide material (e.g., silicon oxide), thereby forming an annular semiconductor oxide portion. Specifically, an annular oxidized portion can be formed by oxidizing a portion of the epitaxial channel portion 11 that is proximal to the physically exposed sidewall of the dielectric collar structure 501. For example, water vapor generator oxidation may be used. In this case, the thickness of the second region of each dielectric collar structure 501 can be selectively increased by incorporating the annular oxidized portion of the epitaxial channel portion 11 into the dielectric collar structure 501. The memory stack structure 55 can comprise a blocking dielectric 503 contacting a sidewall of the memory opening, contacting a top surface of the epitaxial channel portion 11, and having an outer sidewall that is vertically coincident with an outer sidewall of the first uniform thickness region.

Each dielectric collar structure 501 laterally surrounds the epitaxial channel portion 11 and has a first uniform thickness region having a first thickness t1 and a second uniform thickness region having a second thickness t2 that is greater than the first thickness t1. The second uniform thickness region can be located at the level of one of the backside recesses 43 and can contact an outer sidewall of the epitaxial channel portion 11. The first uniform thickness region underlies the second uniform thickness region. An outer sidewall of the second uniform thickness region protrudes outward from a vertical plane including an outer sidewall of the first uniform thickness region. An inner sidewall of the second uniform thickness region is recessed inward from a vertical plane including an inner sidewall of the first uniform thickness region. An outer sidewall of the first uniform thickness region contacts a sidewall of a semiconductor material layer (such as the semiconductor well layer 10) in the substrate (9, 10). An inner sidewall of the first uniform thickness region contacts a sidewall of the epitaxial channel portion 11.

During the oxidation process that provides selective thickening of the dielectric collar structures 501, a surface portion of each source region 61 can be concurrently converted into a sacrificial dielectric portion 616. Each sacrificial dielectric portion 616 includes a dielectric material that includes the same semiconductor element as the source regions 61 and additionally includes oxygen. In one embodiment, the sacrificial dielectric portions 616 can include doped silicon oxide including the same electrical dopants as the source regions 61.

Figure 7:
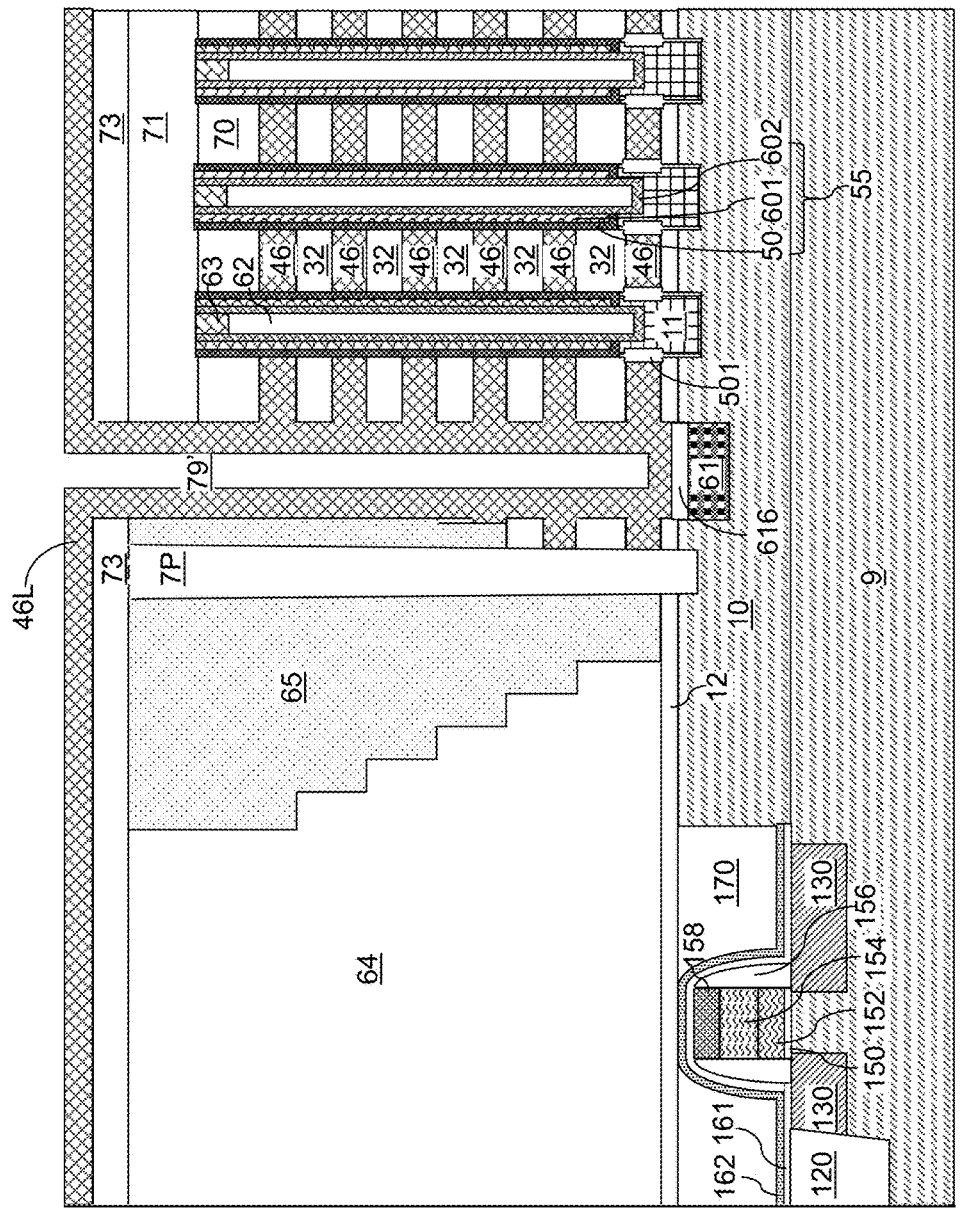
FIG. 7 is a vertical cross-sectional view of the first exemplary structure after formation of electrically conductive layers and a continuous metallic material layer according to the first embodiment of the present disclosure.

Referring to FIG. 7, a backside blocking dielectric layer (not shown) may be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, WF6 and H2 can be employed during the deposition process.

A plurality of electrically conductive layers 46 can be formed in the plurality of backside recesses 43, and a continuous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L.

Figure 8:
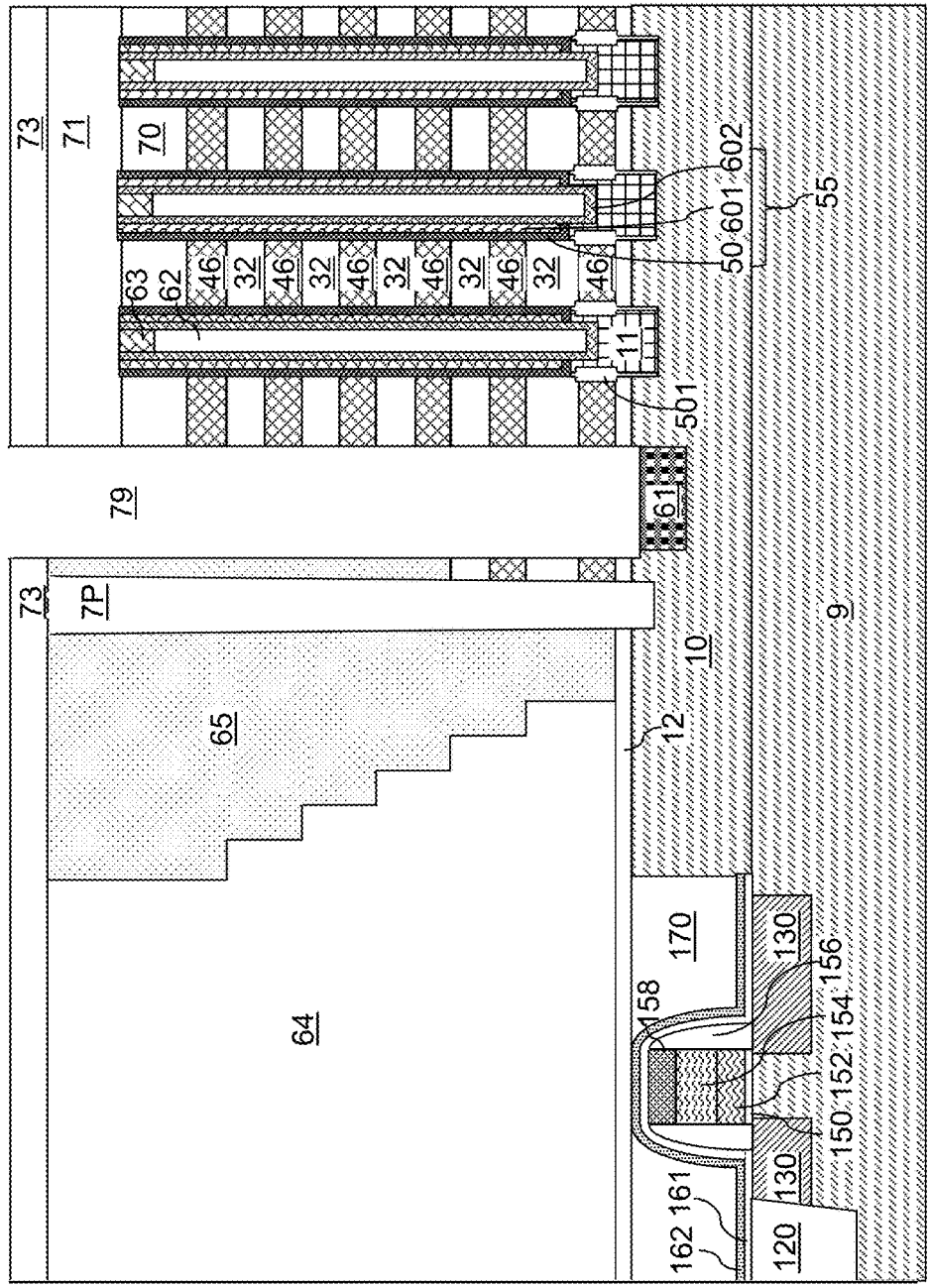
FIG. 8 is a vertical cross-sectional view of the first exemplary structure after removal of the continuous metallic material layer according to the first embodiment of the present disclosure.

Referring to FIG. 8, the deposited metallic material of the continuous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch. Each backside trench 79 extends through the alternating stack (32, 46) of the insulating layers 32 and the electrically conductive layers 46 and to the top surface of the substrate (9, 10).

Figure 9:
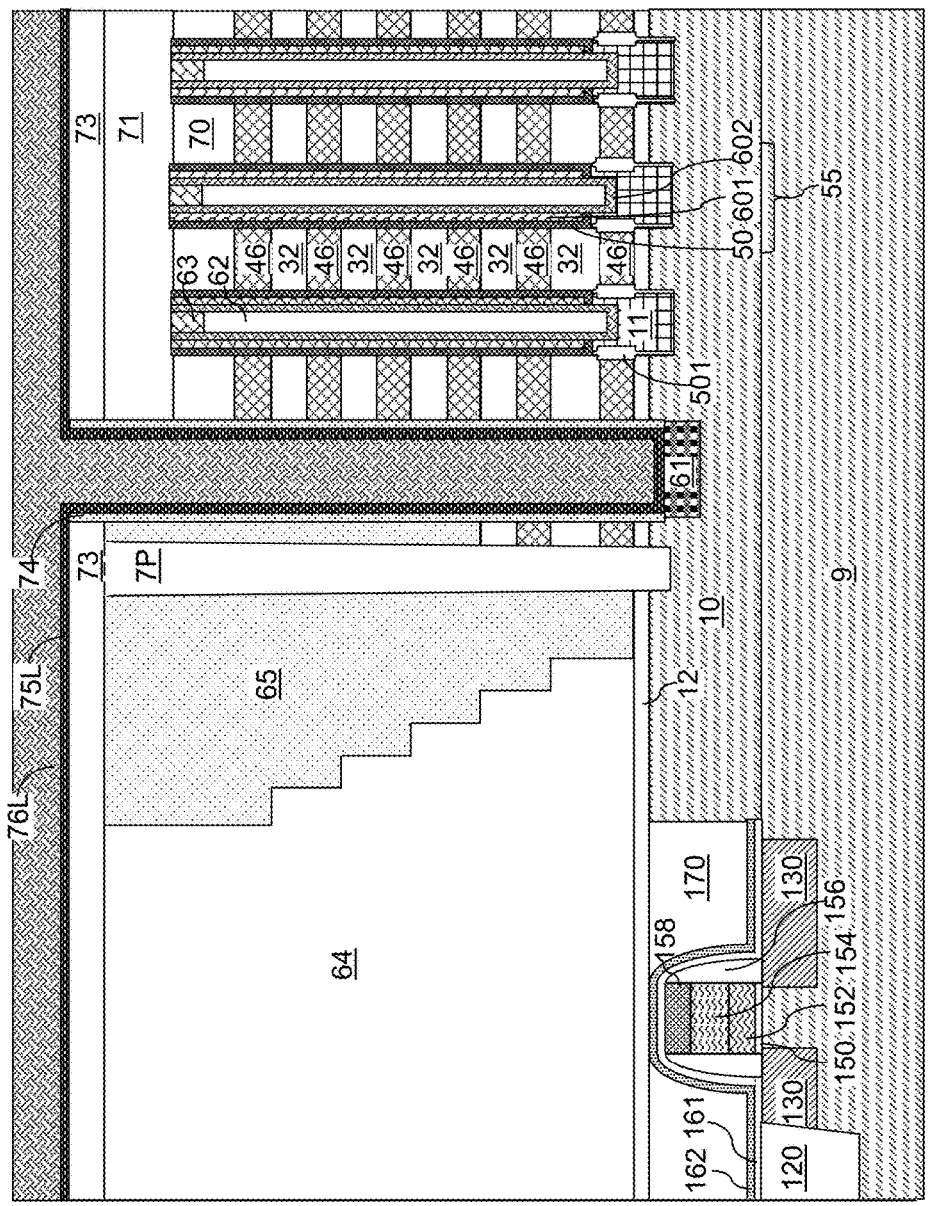
FIG. 9 is a vertical cross-sectional view of the first exemplary structure after formation of insulating spacers and conductive material layers according to the first embodiment of the present disclosure.

Referring to FIG. 9, an insulating material layer can be formed in each backside contact trench 79 and over the second contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. The thickness of the insulating material layer can be in a range from 1.5 nm to 60 nm, although lesser and greater thicknesses can also be employed.

Subsequently, an anisotropic etch is performed to remove horizontal portions of the insulating material layer and to optionally remove the horizontal portion of the backside blocking dielectric layer from above the second contact level dielectric layer 73. Each remaining portion of the insulating material layer inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. Each insulating spacer 74 laterally surrounds a backside cavity at a periphery of a backside trench. A top surface of a source region 61 (which is a doped semiconductor material portion) can be physically exposed at the bottom of each backside cavity that is provided within an insulating spacer 74.

At least one conductive material layer can be deposited in each cavity in the backside trenches and over the contact level dielectric layers (71, 73) by a conformal deposition method. The at least one conductive material layer can include, for example, a metallic diffusion barrier layer 75L and a metallic fill material layer 76L. The metallic diffusion barrier layer 75L can include a metallic material that blocks diffusion of metals into the underlying semiconductor material (such as the semiconductor material of the source regions 61). For example, the metallic diffusion barrier layer 75L can include a conductive metallic nitride such as TiN, TaN, and/or WN, and/or can include a conductive metallic carbide such as TiC, TaC, and/or WC. The metallic fill material layer 76L can include an elemental metal or an intermetallic alloy of at least two metals. For example, the metallic fill material layer 76L can include W, Co, Ru, Al, Cu, or a combination or an alloy thereof.

Figure 10:
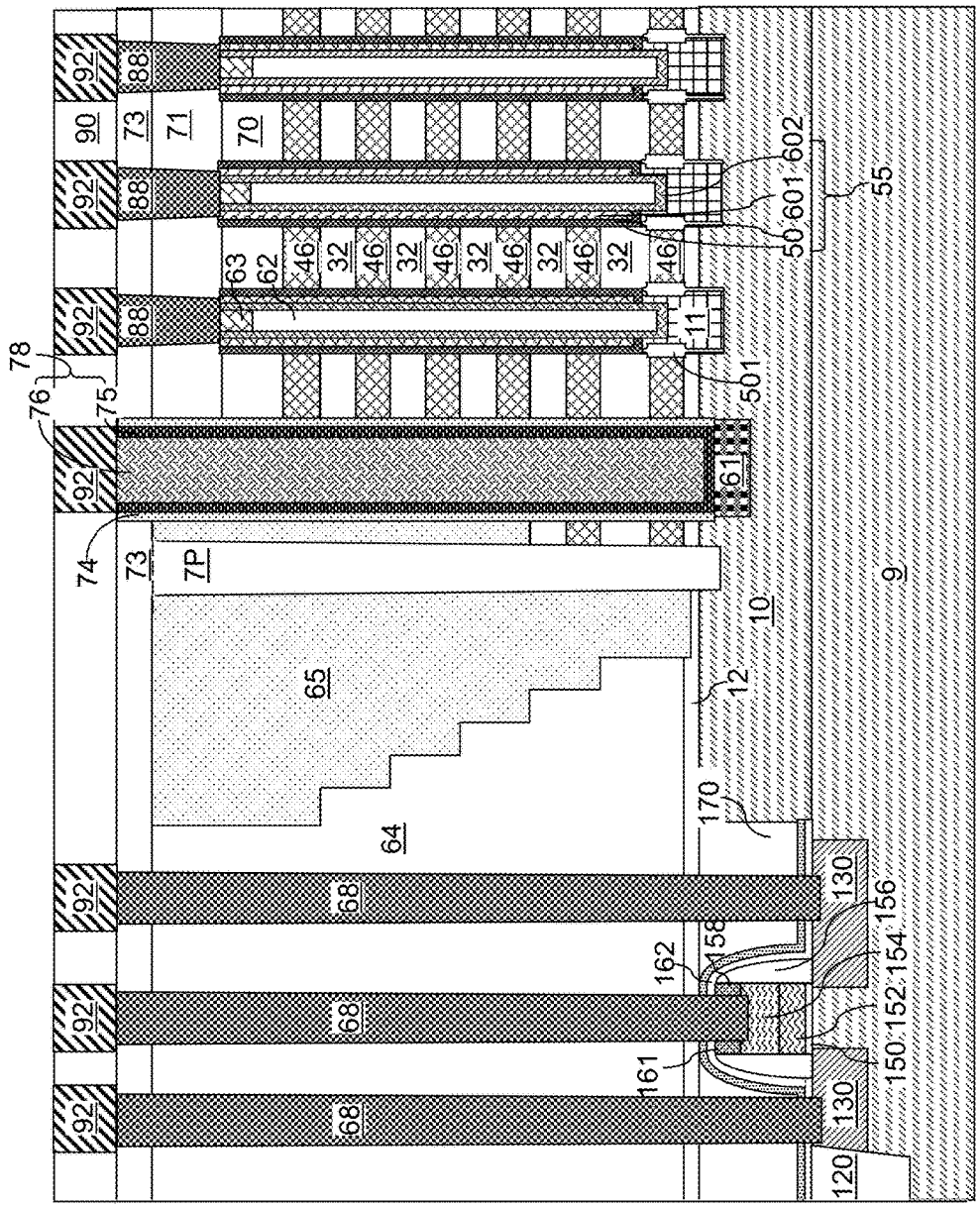
FIG. 10 is a vertical cross-sectional view of the first exemplary structure after formation of contact via structures and metal lines according to the first embodiment of the present disclosure.

Referring to FIG. 10, excess portions of the metallic fill material layer 76L and the metallic diffusion barrier layer 75L can be remove from above a horizontal plane including the top surface of the contact level dielectric layers (71, 73) by a planarization process. For example, a recess etch or chemical mechanical planarization can be employed for the planarization process. Each remaining portion of the metallic fill material layer 76L constitutes a metallic fill material portion 76. Each remaining portion of the metallic diffusion barrier layer 75L constitutes a metallic diffusion barrier portion 75. Each adjoining pair of a metallic diffusion barrier portion 75 and a metallic fill material portion 76 within a contact trench collectively constitutes a contact via structure 78, which can be a source contact via structure that contacts a respective source region 61.

A photoresist layer (not shown) can be applied over the topmost layer of the first exemplary structure (which can be, for example, the second contact level dielectric layer 73), and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures (not shown) can be formed on the respective electrically conductive layers 46. Peripheral device contact via structures 68 can be formed on the respective nodes of the peripheral devices. Additional metal interconnect structures 92 and interlayer dielectric material layers 90 can be formed over the first exemplary structure to provide electrical wiring among the various contact via structures.

The first exemplary structure can include a three-dimensional memory device. The three-dimensional memory device can include an alternating stack of insulating layers 32 and electrically conductive layers 46 located over a substrate (9, 10); a memory opening extending through the alternating stack; an epitaxial channel portion 11 located at a bottom of the memory opening and contacting a portion of the substrate (9, 10); a memory stack structure 55 overlying the epitaxial channel portion 11 and located in the memory opening; and a dielectric collar structure 501 laterally surrounding at least the epitaxial channel portion 11. The dielectric collar structure 501 has a first thickness region having a first thickness t1 and a second thickness region having a second thickness t2 that is greater than the first thickness t1, as shown in FIG. 6B. In one embodiment, the first thickness region may be a first uniform thickness region and the second thickness region may be a second uniform thickness region. The second thickness region can be located at the level of one of the electrically conductive layers 46 and can contact an outer sidewall of the epitaxial channel portion 11.

Referring to FIGS. 11A, a region around a memory opening in a second exemplary structure is illustrated. The second exemplary structure can be derived from the first exemplary structure after the processing steps of FIG. 2C by converting physically exposed portions of the dielectric collar structure 501 above the horizontal plane including the top surface of the epitaxial channel portion 11 and a surface portion of the epitaxial channel portion 11 into a blocking dielectric 513 employing a thermal conversion process or a plasma conversion process within each memory opening 49. For example, if the vertical portions of the dielectric collar structure 501 includes a TEOS oxide (which is dielectric material formed by CVD using a TEOS source and the material including silicon oxide as a predominant component and including carbon and hydrogen at dopant levels), the vertical portions of the blocking dielectric 513 can include thermally densified silicon oxide that is substantially free of hydrogen (e.g., due to hydrogen volatilization) and including carbon at a dopant level. For example, in-situ steam generation (ISSG) may be used for the densification of the blocking dielectric 513. As used herein, a concentration at a dopant level refers to an atomic concentration from 10 parts per million to 3%. If the epitaxial channel portion 11 includes epitaxial silicon or an epitaxial silicon-germanium alloy, the horizontal portion of the blocking dielectric 513 can consist essentially of thermal silicon oxide or a thermal silicon-germanium oxide. The vertical portions and the horizontal portion of the blocking dielectric 513 may have different material compositions, or may have the same material compositions (for example, in the concentration of residual carbon, germanium, or residual electrical dopant that is present in the epitaxial channel portion 11).

Referring to FIG. 11B, the processing steps of FIG. 2F can be performed to deposit a layer stack of a continuous memory material layer 504L, a tunneling dielectric layer 506L, and a first semiconductor channel layer 601L.

Referring to FIG. 11C, the processing steps of FIG. 2G can be performed to anisotropically etch the horizontal portions of the first semiconductor channel layer 601L, the tunneling dielectric layer 506L, the continuous memory material layer 504L, and the blocking dielectric 513, and a surface portion of the epitaxial channel portion 11.

Referring to FIG. 11D, the processing steps of FIGS. 2H-2K can be sequentially performed to form a memory stack structure 50, a semiconductor channel 60, a dielectric core 62, and a drain region 63 within each memory opening. The memory stack structure 50 can include the blocking dielectric 513 as the outer layer.

Figure 11E:
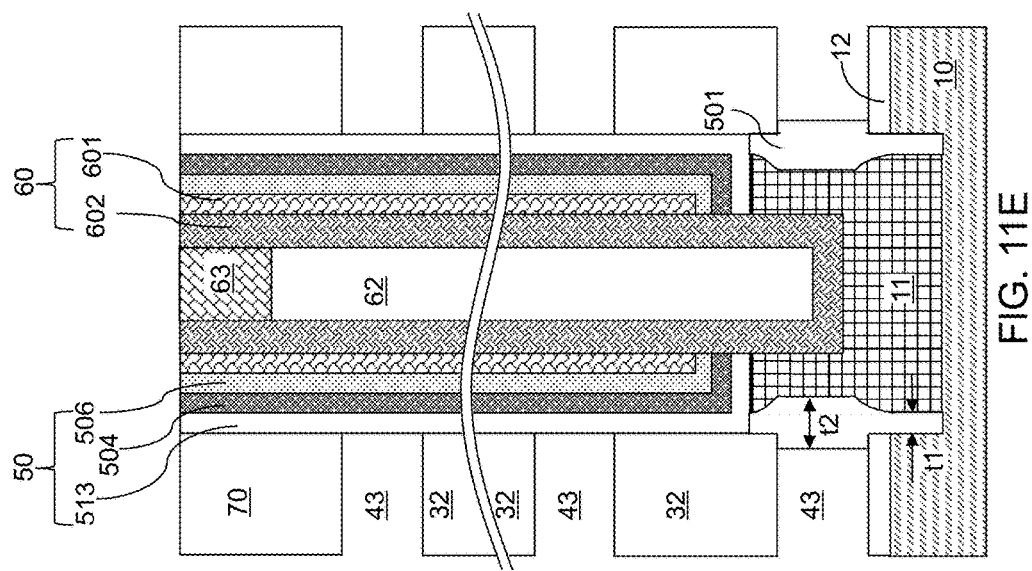
FIG. 11E is a vertical cross-sectional view of a region around a memory opening after removal of the sacrificial material layers according to the second embodiment of the present disclosure.

The processing steps of FIGS. 4, 5A and 5B, and 6A and 6B can be sequentially performed. A region of a memory opening of the second exemplary structure at the end of the processing steps of FIGS. 6A and 6B is illustrated in FIG. 11E, which differs from the region of a memory opening of the first exemplary structure illustrated in FIG. 6B by replacement of the blocking dielectric 503 with the blocking dielectric 513.

Subsequently, the processing steps of FIGS. 7-10 can be performed to provide a completed second exemplary structure, which can differ from the first exemplary structure of FIG. 10 by the composition of the blocking dielectrics. The blocking dielectric 513 can contact a sidewall of the memory opening, can contact a top surface of the epitaxial channel portion 11, and can have an outer sidewall that is vertically coincident with an outer sidewall of the first thickness region having the first thickness t1 of the dielectric collar structure 501.

Referring to FIG. 12A, a region around a memory opening in a third exemplary structure is illustrated. The third exemplary structure can be derived from the first exemplary structure after the processing steps of FIG. 2A by optionally omitting the processing steps of FIG. 2B (i.e., the processing steps that forms the dielectric collar structures 501) prior to forming an epitaxial channel portion 11 in each memory opening 49. Specifically, a selective epitaxy process can be performed after formation of the memory openings 49 to form an epitaxial channel portion 11 on the semiconductor surface underneath each memory opening 49. The process conditions of the selective epitaxy process may, or may not, be conducive to formation of at least one crystallographic facet as the top surface of each epitaxial channel portion 11. In one embodiment, the selective epitaxy process can generate a plurality of crystallographic facets at the top surface of one of more epitaxial channel portions 11. The crystallographic facets can include one or more crystallographic facets that are at an angle (i.e., non-zero angle) with respect to a horizontal plane. The height of each epitaxial channel portion 11 (defined as the average vertical distance between the top surface and the bottom surface of the respective epitaxial channel portion 11) can be greater than the target height for an epitaxial channel portion 11 in a final device structure to be subsequently formed. For example, the top surface of each epitaxial channel portion 11 can be located above the topmost surface of a bottommost pair of an insulating layer 32 and a sacrificial material layer 42 within the alternating stack (32, 42). A memory cavity 49' is present above the epitaxial channel portion 11 within each memory opening.

Referring to FIG. 12B, an upper portion of each epitaxial channel portion 11 can be recessed employing a recess etch process. The chemistry of the etch process can be selected such that the total physically exposed area of each remaining portion of the epitaxial channel portion 11 can decrease during the recess etch process. The recess etch process can remove a protruding portion of each epitaxial channel portion 11 at a greater etch rate than a non-protruding portion of the epitaxial channel portion 11. As used herein, a "non-protruding portion" refers to any portion that is not a protruding portion, and can be a recessed portion or a planar portion from which at least one protruding portion protrudes out. In one embodiment, the chemistry of the etch process can include a mixture of an isotropic etch component and an anisotropic etch component.

In one embodiment, the recess etch process can include a wet etch process that removes the semiconductor material of the epitaxial channel portion 11 selective to the materials of the alternating stack (32, 42). In one embodiment, the wet etch process can employ trimethyl-2 hydroxyethyl ammonium hydroxide ("TMY") as a primary etchant, which has the effect of removing protruding portions of a semiconductor material (such as silicon) faster than non-protruding portions of the semiconductor material.

In one embodiment, the recess etch process comprises a remote plasma assisted dry etch process that removes the semiconductor material of the epitaxial channel portion 11 selective to the materials of the alternating stack (32, 42). In one embodiment, the remote plasma assisted dry etch process simultaneously provides $H_2$, $NF_3$ and $NH_3$ plasma by-products to the epitaxial channel portion 11 to remove protruding portions of a semiconductor material (such as silicon) faster than non-protruding portions of the semiconductor material. In one embodiment, the wet etch and dry etch processes are performed sequentially.

The recess etch removes, or makes more planar, the top surface of each epitaxial channel portion 11. Each epitaxial channel portion 11 can have a horizontal or substantially horizontal top surface (i.e., substantially parallel to top surface 7 of the substrate), or can have reduced height variation compared to the height variation prior to the recess etch. The average height of each epitaxial channel portion 11 can be substantially the same as the target height of the epitaxial channel portions 11 in the final device structure.

Referring to FIG. 12C, the processing steps of FIG. 2E can be performed to form a blocking dielectric layer 503L. In one embodiment, the bottom surface of the blocking dielectric layer 503L can be formed on a planar top surface of the epitaxial channel portion 11 within each memory opening, or can be formed on a top surface of the epitaxial channel portion 11 having peak-to-peak height variation less than 10 nm.

Referring to FIG. 12D, the processing steps of FIG. 2F can be performed to deposit a layer stack of a continuous memory material layer 504L, a tunneling dielectric layer 506L, and a first semiconductor channel layer 601L.

Referring to FIG. 12E, the processing steps of FIGS. 2G-2K can be sequentially performed to form a memory stack structure 50, a semiconductor channel 60, a dielectric core 62, and a drain region 63 within each memory opening. The memory stack structure 50 can include the blocking dielectric 503 as the outer layer. In one embodiment, the physically exposed semiconductor surface at the bottom of each cavity 49' is vertically recessed so that the recessed semiconductor surface epitaxial channel portion 11 by of underneath the cavity 49' is vertically offset from the topmost surface of the epitaxial channel portion 11 by a recess distance 49R, as shown in FIG. 12E. In this embodiment, the recess distance 49R is uniform across the entire with of the cavity 49' (i.e., the recess in the cavity 49' has a uniform depth) because the top surface of the epitaxial channel portion 11 is planar due to the planarization step shown in FIG. 12B. Therefore, etching a recess in the planar surface results in a uniform depth recess after etching the recess.

The processing steps of FIGS. 4, 5A and 5B, and 6A and 6B can be sequentially performed. Due to the absence of a dielectric collar structure 501 in each memory opening, the oxidation process that converts the surface portion of each epitaxial channel portion into a semiconductor oxide portion and forms an annular dielectric spacer 611 concurrently with formation of sacrificial dielectric portions 616 on a top surface of each source region 61 as illustrated in FIG. 12F. Each annular dielectric portion 611 can include an oxide of the semiconductor material (e.g., silicon oxide) of the epitaxial channel portions 11. Each annular dielectric portion 611 can be topologically homeomorphic to a torus, and can have a bird's beak at a top portion and at a bottom portion thereof.

Subsequently, the processing steps of FIGS. 7-10 can be performed to provide a completed third exemplary structure, which can differ from the first exemplary structure of FIG. 10 by the presence of annular dielectric portions 611 instead of dielectric collar structure 501.

Referring to FIG. 13A, an alternate embodiment of the third exemplary structure can be derived from the third exemplary structure at the processing step of FIG. 12A by oxidizing an upper portion of each epitaxial channel portion 11. A thermal oxidation process or a plasma oxidation process (e.g., ISSG) can be employed to form a semiconductor oxide portion 19 by conversion of an upper portion of a respective epitaxial channel portion 11. The process conditions of the oxidation process can be selected such that each remaining portion of the epitaxial channel portions 11 has a height that is substantially the same as the target height of the epitaxial channel portions 11 in a final device structure.

Referring to FIG. 13B, the semiconductor oxide portion 19 can be removed selective to the remaining portions of the epitaxial channel portions 11 by an anisotropic etch. For example, if the epitaxial channel portions 11 include silicon and if the semiconductor oxide portions 19 include silicon oxide, a reactive ion etch (e.g., high bias dry etch) that removes silicon oxide selective to silicon can be employed. The removal leaves a planar top surface of portion 11.

Subsequently, the processing steps of FIGS. 12C-12F, 4, 5A and 5B, 6A and 6B, and 7-10 can be performed to form a structure, which can be substantially the same as the third exemplary structure.

Figure 14:
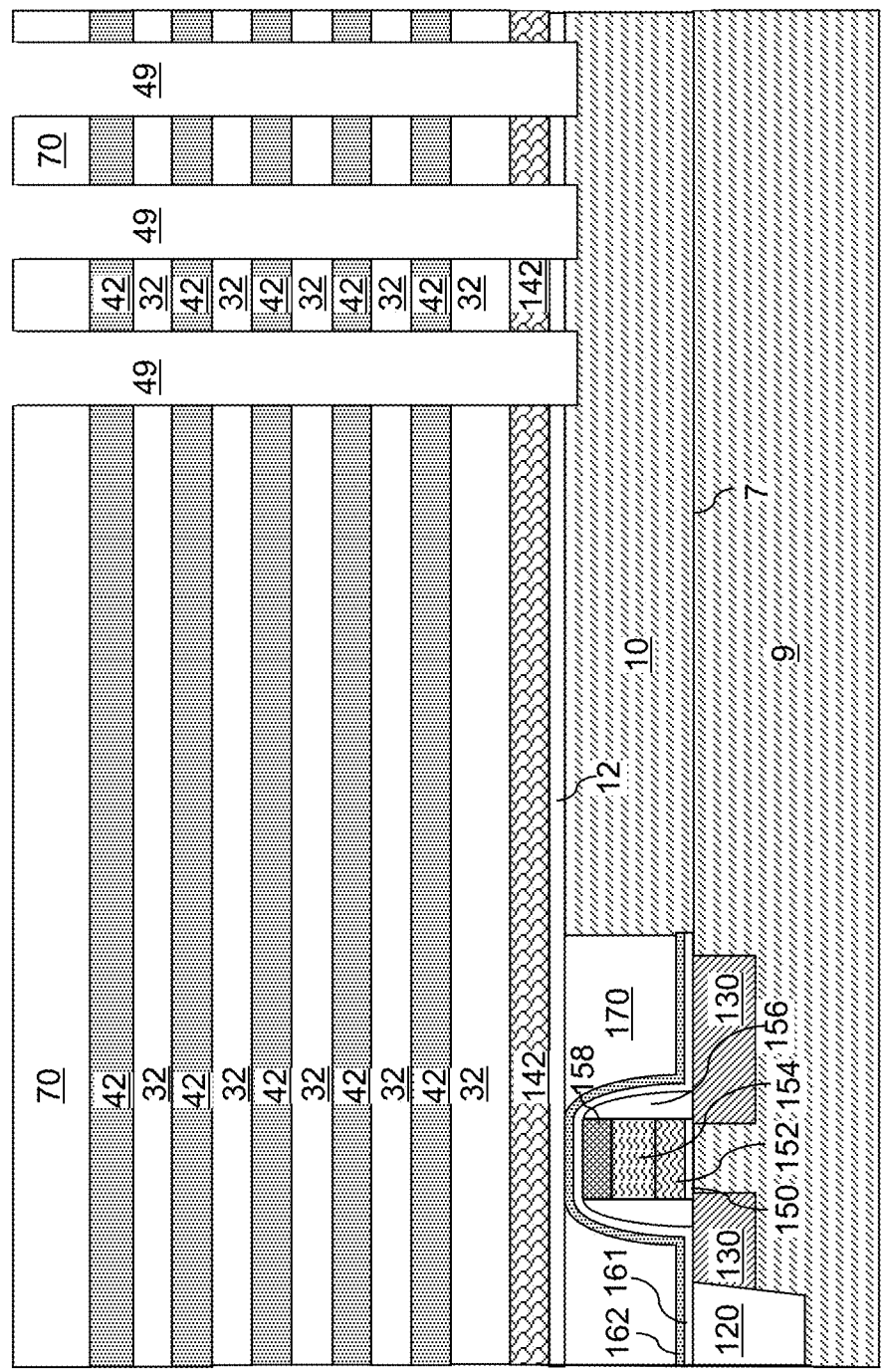
FIG. 14 is a vertical cross-sectional view of a fourth exemplary structure after formation of an alternating stack of insulating layers and sacrificial material layers and memory openings extending through the alternating stack according to a fourth embodiment of the present disclosure.

Referring to FIG. 14, a fourth exemplary structure according to a fourth embodiment of the present disclosure can be derived from the first exemplary structure of FIG. 1 by substituting the bottommost sacrificial material layer 42 with a sacrificial semiconductor material layer 142. For example, the sacrificial material layer 142 can be formed in lieu of the bottommost sacrificial material layer 42 during the processing steps of FIG. 1. The sacrificial semiconductor material layer 142 can include a semiconductor material, which can be, for example, amorphous silicon, an amorphous silicon-germanium alloy, doped or undoped polysilicon, or a polycrystalline silicon-germanium alloy. In one embodiment, the sacrificial semiconductor material layer 142 can include a material that oxidizes at a higher rate than the semiconductor material of the physically exposed portions of the substrate (9, 10) underneath the memory openings 49. For example, the semiconductor well layer 10 can include single crystalline silicon, and the sacrificial semiconductor material layers 142 can include a silicon-germanium alloy, an amorphous silicon material, or a doped amorphous or polycrystalline silicon-containing material that provides a higher oxidation rate than single crystalline silicon having no doping or low doping with electrical dopants. The sacrificial semiconductor material layer 142 can be deposited as a planar layer employing a deposition process such as chemical vapor deposition (CVD). The thickness of the sacrificial semiconductor material layer 142 can be in a range from 20 nm to 50 nm, although lesser and greater thicknesses can also be employed. The alternating stack (32, 42) is then formed.

Referring to FIG. 15A, a region including a memory opening 49 of the fourth exemplary structure is illustrated. A horizontal semiconductor surface and a vertical semiconductor surface can be physically exposed underneath each memory opening 49.

Referring to FIG. 15B, a dielectric semiconductor compound layer 501L can be formed within each memory opening 49 by conversion of the physically exposed surface portions of the sacrificial semiconductor material layer 142 and the semiconductor material underlying the memory opening 49 (such as the surface portions of the semiconductor well layer 10) into a continuous dielectric material layer. The duration of the conversion process is selected such that a dielectric material portion that grows from the sidewall surface of each sacrificial semiconductor material layer 142 merges with another dielectric material portion that grows from the physically exposed surfaces of the substrate (9, 10) underneath the memory opening 49 such that each dielectric semiconductor compound layer 501L is formed as a single layer within each memory opening 49. The conversion process can include a thermal oxidation process, a thermal nitridation process, a plasma oxidation process, and/or a plasma nitridation process (e.g., oxidation by water vapor generator). For example, the conversion process can be a thermal oxidation process or a plasma oxidation process. In this case, the dielectric semiconductor compound layer 501L includes at least one semiconductor oxide material. The at least one semiconductor oxide material can be two different semiconductor oxide materials (if the semiconductor well layer 10 and the sacrificial semiconductor material layer 142 include two different semiconductor materials) or can be the same semiconductor oxide material (if the semiconductor well layer 10 and the sacrificial semiconductor material layer 142 have the same semiconductor material with different crystallinity). Layer 501L may comprise silicon oxide.

In one embodiment, the sacrificial semiconductor material layer 142 may include a semiconductor material that oxidizes faster than the semiconductor material of the semiconductor well layer 10 (or the substrate semiconductor layer 9 in case a semiconductor well layer is not employed). For example, the semiconductor well layer 10 can include single crystalline silicon, and the sacrificial semiconductor material layer 142 can include an amorphous or polycrystalline silicon-germanium alloy material, amorphous silicon, or a doped amorphous or polycrystalline silicon-containing material that provides a higher oxidation rate than single crystalline silicon having no doping or low doping with electrical dopants. In this case, each vertical portion of a dielectric semiconductor compound layer 501L can have a first thickness region having a first thickness t1 and a second thickness region having a second thickness t2 that is greater than the first thickness t1. Each second thickness region can be located at the level of the sacrificial semiconductor material layer 142.

Referring to FIG. 15C, an anisotropic etch can be performed to remove the horizontal portion of the dielectric semiconductor compound layer 501L within each memory opening 49. Each remaining portion of a dielectric semiconductor compound layer 501L constitutes a dielectric collar structure 501, which includes a first thickness region having a first thickness t1 and a second thickness region having a second thickness t2 that is greater than the first thickness t1. A horizontal top surface of the underlying semiconductor material (which can be, for example, a recessed surface of the semiconductor well layer 10) is physically exposed at the bottom of each memory opening 49.

Referring to FIG. 15D, the processing steps of FIG. 12A can be performed to form an epitaxial channel portion at the bottom of each memory opening 49. In this case, a portion of a sidewall surface of each epitaxial channel portion 11 can contact a respective dielectric collar structure 501.

Referring to FIG. 15E, the processing steps of FIG. 12B or the processing steps of FIGS. 13A and 13B can be performed to remove an upper portion of each epitaxial channel portion 11 such that the total physically exposed area of each remaining portion of the epitaxial channel portion 11 can decrease during the recess etch process. The removal process can remove a protruding portion of each epitaxial channel portion 11 at a greater removal rate than a non-protruding portion of the epitaxial channel portion 11.

Referring to FIG. 15F, the processing steps of FIG. 12C can be performed to form a blocking dielectric layer 503L.

Referring to FIG. 15G, the processing steps of FIG. 2F can be performed to deposit a layer stack of a continuous memory material layer 504L, a tunneling dielectric layer 506L, and a first semiconductor channel layer 601L.

Referring to FIG. 15H, the processing steps of FIGS. 2G-2K can be sequentially performed to form a memory stack structure 50, a semiconductor channel 60, a dielectric core 62, and a drain region 63 within each memory opening. The memory stack structure 50 can include the blocking dielectric 503 as the outer layer.

The processing steps of FIGS. 4, 5A and 5B, and 6A and 6B can be sequentially performed. Referring to FIG. 16A, a region around a memory opening of the fourth exemplary structure is illustrated after the processing steps of FIGS. 6A and 6B as modified to remove the sacrificial semiconductor material layer 142. Specifically, at the processing steps of FIGS. 6A and 6B, the etch process that removes the sacrificial material layers 42 can be modified, or amended, to remove the sacrificial semiconductor material layer 142. An etch process (e.g., TMY etch) that removes the material of the sacrificial semiconductor material layer 142 selective to the materials of the insulating layers 42 can be employed. In this case, the backside trenches 79 can be formed in two steps such that the backside trenches 79 does not extend below the gate dielectric layer 12 at the time of removal of the sacrificial semiconductor material layer 142 so that collateral etching of the source regions 61 can be avoided. If the etch process that removes the sacrificial semiconductor material layer 142 does not remove the sacrificial material layers 42, the sacrificial material layers 42 can be removed selective to the insulating layers 32 employing another etch process (e.g., hot phosphoric acid etch). The backside trenches 79 can be extended further downward after removal of the sacrificial semiconductor material layer 142.

Optionally, an oxidation process may be performed to thicken the portion of each dielectric collar structure 501 at the level of the bottommost backside recess 43 after removal of the sacrificial semiconductor material layer 142 therefrom. Each dielectric collar structure 501 can be topologically homeomorphic to a torus.

Referring to FIG. 16B, a region of a memory opening of the fourth exemplary structure is illustrated after the processing steps of FIG. 7, which deposits an optional backside dielectric layer 41 and conductive material layers 46. If the optional backside dielectric layer 41 is not employed, the conductive material layers 46 can contact an outer sidewall of a memory stack structure 50 or an outer sidewall of a dielectric collar structure 501. If the optional backside dielectric layer 41 is employed, the backside blocking dielectric 41 (which can be a continuous layer) can contact an outer sidewall of a memory stack structure 50 or an outer sidewall of a dielectric collar structure 501 at each level of the electrically conductive layers 46.

Subsequently, the processing steps of FIGS. 8-10 can be performed to provide a completed fourth exemplary structure, which can differ from the first exemplary structure of FIG. 10 by the material composition of the dielectric collar structure 501. Specifically, the material composition of the dielectric collar structure 501 can be free of a deposited dielectric material, and can consist of at least one dielectric material derived from conversion of at least one semiconductor material. In one embodiment, the dielectric collar structure 501 of the fourth exemplary structure can include two dielectric materials derived from conversion of a portion of a semiconductor material in the substrate (9, 10) and from conversion of the semiconductor material of the sacrificial semiconductor material layer 142.

Referring to FIG. 17A, a region of a memory opening 49 of a fifth exemplary structure is illustrated, which can be derived from the fourth exemplary structure by modifying the depth of the memory openings 49 as formed after the processing steps of FIG. 1. Specifically, an anisotropic etch process that forms the memory openings 49 is terminated after etching through the sacrificial semiconductor material layer 142 and prior to etching through the gate dielectric layer 12. Thus, the semiconductor surface of the substrate (9, 10) is not physically exposed to the memory opening 49 after the processing steps of FIG. 1.

Referring to FIG. 17B, an annular dielectric spacer 611 can be formed by conversion of a surface portions of the sacrificial semiconductor material layer 142 into a dielectric material portion. The conversion process can include a thermal oxidation process, a thermal nitridation process, a plasma oxidation process, and/or a plasma nitridation process. For example, the conversion process can be a thermal oxidation process or a plasma oxidation process. In this case, the annular dielectric spacer 611 includes a semiconductor oxide material, such as silicon oxide.

Referring to FIG. 17C, a conformal dielectric material layer 501L is deposited over the physically exposed surfaces of the memory openings 49 and the annular dielectric spacers 611, and over the top surface of the insulating cap layer 70. The conformal dielectric material layer 501L can have the same thickness and/or the same composition as the conformal dielectric material layer deposited at the processing steps of FIG. 2B, and can be formed employing the same deposition method as at the processing steps of FIG. 2B.

Referring to FIG. 17D, an anisotropic etch is performed to remove horizontal portions of the conformal dielectric material layer 501L from above the insulating cap layer 70 and at the bottom of each memory opening 49. Further, the anisotropic etch is extended to remove horizontal portions of the gate dielectric layer 12 underneath each memory opening 49, and to remove portions of the conformal dielectric material layer 501L that protrude inward due to the presence of the annular dielectric spacers 611 underneath the vertical portions of the conformal dielectric material layer 501L that contact sidewalls of the alternating stack (32, 42).

The anisotropic etch process can vertically extend each memory opening 49 through the gate dielectric layer 12. A semiconductor surface of the substrate (9, 10) can be vertically recessed below an opening in the gate dielectric layer 12 underneath each cavity 49' in the memory openings 49. In each memory opening 49, a dielectric collar structure 501 can be formed by a combination of the annular dielectric spacer 611 and a vertical portion of the conformal dielectric material layer 501L that remains after the anisotropic etch process. Thus, each dielectric collar structure 501 can include the material of an annular dielectric spacer 611 and the material of a vertically extending portion of the conformal dielectric material layer 501L. The dielectric collar structures 501 can be formed at a periphery of a respective memory opening 49 by forming annular dielectric spacers 611 and by forming and anisotropically etching the conformal dielectric material layer 501L. Because inwardly protruding portions of the conformal dielectric material layer 501 over each annular dielectric spacer 611 is removed during the anisotropic etch, each inner sidewall of the dielectric collar structures 501 can extend vertically without a step.

Each dielectric collar structure 501 can have a first thickness region having a first thickness t1 and a second thickness region having a second thickness t2 that is greater than the first thickness t1. The second thickness region can be located at the level of the sacrificial semiconductor material layer 142. The first thickness region overlies the second thickness region. An outer sidewall of the second thickness region protrudes outward from a vertical plane including an outer sidewall of the first thickness region. An inner sidewall of the second thickness region is located within a same vertical plane (having a curvature only within horizontal planes and not having any curvature in vertical planes) as the inner sidewall of the first thickness region.

Referring to FIG. 17E, an epitaxial channel portion 11 can be formed in each memory opening 49 as in the third or fourth embodiment. In this case, the processing steps of the third or fourth embodiment can be performed to recess an upper portion of each epitaxial channel portion 11 to provide the epitaxial channel portion 11 illustrated in FIG. 17F. Alternatively, the processing steps of FIG. 17E can be omitted, and each epitaxial channel portions 11 can be formed as illustrated in FIG. 17F employing the methods of the first or second embodiment, i.e., to a target size without employing removal of an upper portion of each epitaxial channel portion 11.

Figure 17G:
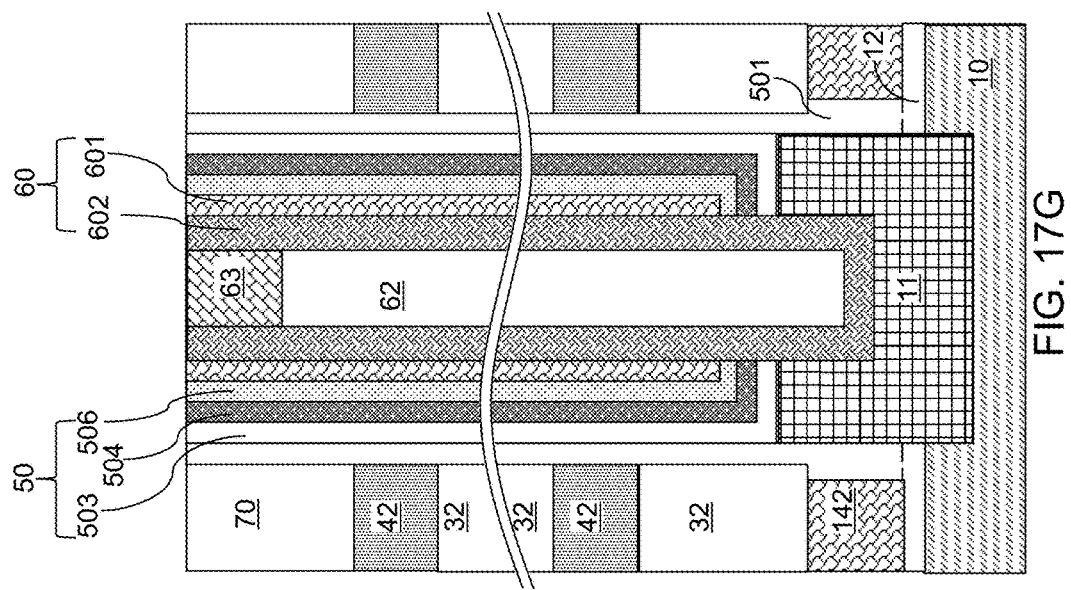

Referring to FIG. 17G, the processing steps of FIGS. 2E-2K can be performed form a memory stack structure 50, a semiconductor channel 60, a dielectric core 62, and a drain region 63 within each memory opening. The memory stack structure 50 can include the blocking dielectric 503 as the outer layer.

The processing steps of FIGS. 4, 5A and 5B, and 6A and 6B can be sequentially performed. Referring to FIG. 18A, a region around a memory opening of the fifth exemplary structure is illustrated after the processing steps of FIGS. 6A and 6B as modified to remove the sacrificial semiconductor material layer 142. The same type of modification can be performed to the etch processes as in the fourth embodiment.

Optionally, an oxidation process may be performed to thicken the portion of each dielectric collar structure 501 at the level of the bottommost backside recess 43 after removal of the sacrificial semiconductor material layer 142 therefrom. In this case, the structure 501 protrudes inward and outward with respect to the memory opening 49. Each dielectric collar structure 501 can be topologically homeomorphic to a torus.

Referring to FIG. 18B, a region of a memory opening of the fourth exemplary structure is illustrated after the processing steps of FIG. 7, which deposits an optional backside dielectric layer 41 and conductive material layers 46. If the optional backside dielectric layer 41 is not employed, the conductive material layers 46 can contact an outer sidewall of a memory stack structure 50 or an outer sidewall of a dielectric collar structure 501. If the optional backside dielectric layer 41 is employed, the backside blocking dielectric 41 (which can be a continuous layer) can contact an outer sidewall of a memory stack structure 50 or an outer sidewall of a dielectric collar structure 501 at each level of the electrically conductive layers 46.

Subsequently, the processing steps of FIGS. 8-10 can be performed to provide a completed fifth exemplary structure. The fifth exemplary structure can include a three-dimensional memory device. The three-dimensional memory device can include an alternating stack of insulating layers 32 and electrically conductive layers 46 located over a substrate (9, 10); a memory opening extending through the alternating stack; an epitaxial channel portion 11 located at a bottom of the memory opening and contacting a portion of the substrate (9, 10); a memory stack structure 55 overlying the epitaxial channel portion 11 and located in the memory opening; and a dielectric collar structure 501 laterally surrounding at least the epitaxial channel portion 11. The dielectric collar structure 501 has a first thickness region having a first thickness t1 and a second thickness region having a second thickness t2 that is greater than the first thickness t1, as shown in FIG. 18B. The second thickness region can be located at the level of one of the electrically conductive layers 46 (which can be the bottommost electrically conductive layer 46) and can contact an outer sidewall of the epitaxial channel portion 11.

Each dielectric collar structure 501 laterally surrounds the epitaxial channel portion 11. The second thickness region can be located at the level of one of the backside recesses 43 and can contact an outer sidewall of the epitaxial channel portion 11. The first thickness region overlies the second thickness region. An outer sidewall of the second thickness region protrudes outward from a vertical plane including an outer sidewall of the first thickness region. An inner sidewall of the second thickness region can be vertically coincident with a vertical plane including an inner sidewall of the first thickness region if the thickening step is omitted. Alternatively, if the thickening step is performed, the structure 501 may protrude inward and outward such that there is no vertical coincidence of the inner sidewalls of the first and second thickness regions. An outer sidewall of the first thickness region contacts sidewalls of the alternating stack (32, 46). An inner sidewall of the first thickness region contacts a sidewall of a memory stack structure 50.

Referring to FIG. 19A, a region around a memory opening in a sixth exemplary structure is illustrated. The sixth exemplary structure can be the same as the third exemplary structure illustrated in FIG. 12A. Specifically, a selective epitaxy process can be performed after formation of the memory openings 49 to form an epitaxial channel portion 11 on the semiconductor surface underneath each memory opening 49. The process conditions of the selective epitaxy process may, or may not, be conducive to formation of at least one crystallographic facet as the top surface of each epitaxial channel portion 11. In one embodiment, the selective epitaxy process can generate a plurality of crystallographic facets at the top surface of one of more epitaxial channel portions 11. The crystallographic facets can include one or more crystallographic facets that are at an angle (i.e., non-zero angle) with respect to a horizontal plane. The height of each epitaxial channel portion 11 (defined as the average vertical distance between the top surface and the bottom surface of the respective epitaxial channel portion 11) can be greater than the target height for an epitaxial channel portion 11 in a final device structure to be subsequently formed. For example, the top surface of each epitaxial channel portion 11 can be located above the topmost surface of a bottommost pair of an insulating layer 32 and a sacrificial material layer 42 within the alternating stack (32, 42).

In one embodiment, the horizontal top surface of the semiconductor well layer 10 can include a surface that is not a {100} surface. In this case, the crystallographic facets of the epitaxial channel portion 11 can include {100} surfaces, such as (100) surfaces, which are not vertical, i.e., are at a non-orthogonal angle with respect to horizontal directions. A memory cavity 49' is present above the epitaxial channel portion 11 within each memory opening.

Referring to FIG. 19B, an upper portion of each epitaxial channel portion 11 can be recessed employing a recess etch process. The chemistry of the etch process can be selected such that a remaining portion of the epitaxial channel portion 11 comprises a chamfer 11C having an upper edge that adjoins a periphery of a horizontal top surface 11H of the epitaxial channel portion 11 and a lower edge that adjoins a sidewall of the memory opening 49. As used herein, a "chamfer" refers to a sloping surface that adjoins a horizontal surface, similar to a bevel. A chamfer may, or may not, have a curvature. As used herein, a chamfer may have an angle of 45 degrees with an adjacent surface or it may have another non-right angle besides 45 degrees with the adjacent surface, such as any angle between 10 and 80 degrees. In one embodiment, removal of the upper portion of the epitaxial channel portion 11 can be performed through a recess etch process that removes peripheral regions of crystallographic facets at a greater etch rate than center regions of the crystallographic facets. In an illustrative example, {100} facets in peripheral portions of the epitaxial channel portion 11 can be removed at a greater etch rate than the {100} facets in the central portion of the epitaxial channel portion 11 employing etch chemistries selected to provide non-uniform etch rate as a function of a distance from a periphery of the facets. This results in a horizontal portion 11H (i.e., having a top surface parallel to the top surface 7 of the substrate) in the center portion of the epitaxial channel portion 11 and the chamfer 11C in the peripheral portion of the epitaxial channel portion 11. In an alternative embodiment, the center portion of the epitaxial channel portion 11 may have a curved surface rather than a horizontal surface.

In one embodiment, the recess etch process can include a wet etch process that removes the semiconductor material of the epitaxial channel portion 11 selective to the materials of the alternating stack (32, 42). In one embodiment, the wet etch process can employ a buffered etchant including trimethyl-2 hydroxyethyl ammonium hydroxide ("TMY") as a primary etchant and including ammonium hydroxide in a buffered solution. The volume ratio of TMY to ammonium hydroxide can be in a range from 1:10 to 1:1,000, such as from 1:30 to 1:300, for example 1; 100. In one embodiment, the buffered solution can further include hydrogen peroxide and deionized water, which may act as an accelerant and a diluent, respectively. In case deionized water is employed, the volume ratio of the combination of TMY and ammonium hydroxide to deionized water can be in a range from 3:1 to 1:30, although lesser and greater ratios can also be employed. In case hydrogen peroxide is employed, the volume ratio of the combination of TMY and ammonium hydroxide to hydrogen peroxide can be in a range from 100:1 to 3:1, although lesser and greater ratios can also be employed. In one embodiment, the wet etch process can be performed at a temperature selected from a range from 20 degrees Celsius to 75 degrees Celsius, such as from 45 degrees Celsius to 65 degrees Celsius.

In one embodiment, the recess etch process comprises a remote plasma assisted dry etch process that removes the semiconductor material of the epitaxial channel portion 11 selective to the materials of the alternating stack (32, 42). In one embodiment, the remote plasma assisted dry etch process simultaneously flows $NF_3$ and $CH_4$ gases to a plasma generation chamber, wherein a flow rate of $CH_4$ is greater than a flow rate of $NF_3$. In this case, the remote plasma assisted dry etch process can simultaneously provide $NF_3$ and $CH_4$ plasma by-products to the epitaxial channel portion 11. In one embodiment, the remote plasma assisted dry etch process can provide at least one inert gas selected from $N_2$ and argon simultaneously with application of the $NF_3$ and $CH_4$ plasma by-products to the epitaxial channel portion. In an illustrative example, the flow rate of $NF_3$ can be in a range from 1 standard cubic centimeter per minute to 50 standard cubic centimeters per minute, the flow rate of $CF_4$ can be in a range from 10 standard cubic centimeter per minute to 80 standard cubic centimeters per minute, and the flow rate of the at least one inert gas can be in a range from 50 standard cubic centimeter per minute to 200 standard cubic centimeter per minute. In another embodiment, both the above described wet etch and dry etch processes are used sequentially.

In one embodiment, the chamfer 11C includes an inner periphery and an outer periphery. The inner periphery of the chamfer 11C can include an upper edge of the chamfer 11C, and the outer periphery of the chamfer 11C can include a lower edge of the chamfer 11C. In one embodiment, the chamfer 11C can include at least one convex surface. In one embodiment, the chamfer 11C can be free of crystallographic facets. In one embodiment, the chamfer 11C can include convex (i.e., curved) surfaces that may face generally along {100} directions.

In one embodiment, the chamfer 11C can laterally surround the horizontal top surface 11H of the epitaxial channel portion 11 such that an entire periphery of the horizontal top surface 11H of the epitaxial channel portion is laterally spaced from the sidewall of the memory opening 49 by the chamfer.

Referring to FIG. 19C, the processing steps of FIG. 2E can be performed to form a blocking dielectric layer 503L. In one embodiment, the bottom surface of the blocking dielectric layer 503L can be formed on top surface of the epitaxial channel portion 11 within each memory opening. The blocking dielectric layer 503L contains a center horizontal portion 503H (which is parallel to the top surface 7 of the substrate) located on portion 11H of the epitaxial channel portion 11, and non-horizontal protrusions 503P extending downward toward the substrate which are located on the chamfer 11C of the epitaxial channel portion 11.

Referring to FIG. 19D, the processing steps of FIG. 2F can be performed to deposit a layer stack of a continuous memory material layer 504L, a tunneling dielectric layer 506L, and a first semiconductor channel layer 601L.

Referring to FIG. 19E, the processing steps of FIGS. 2G-2K can be sequentially performed to form a memory stack structure 50, a semiconductor channel 60, a dielectric core 62, and a drain region 63 within each memory opening. The memory stack structure 50 can include the blocking dielectric 503 as the outer layer. The chamfer 11C can be in contact with a surface the protrusions 503P of the blocking dielectric 503 within the memory stack structure 55.

The dielectric collar portion 501 is optional in this embodiment. The processing steps of FIGS. 4, 5A and 5B, and 6A and 6B can be sequentially performed. If the dielectric collar structure 501 is omitted, then the oxidation process that converts the surface portion of each epitaxial channel portion into a semiconductor oxide portion and forms an annular dielectric spacer 611, as shown in FIG. 19F, concurrently with formation of sacrificial dielectric portions 616 on a top surface of each source region 61 as shown in FIG. 6A. Each annular dielectric portion 611 can include an oxide of the semiconductor material (e.g., silicon oxide) of the epitaxial channel portions 11. Each annular dielectric portion 611 can be topologically homeomorphic to a torus, and can have a bird's beak at a top portion and at a bottom portion thereof.

Subsequently, the processing steps of FIGS. 7-10 can be performed to provide a completed sixth exemplary structure, which can differ from the third exemplary structure by the presence of the chamfer 11C at a periphery of the epitaxial channel portion 11.

A three-dimensional memory device provided according to the sixth embodiment of the present disclosure can include an alternating stack of insulating layers 32 and electrically conductive layers 46 located over a substrate (9, 10); a memory opening 49 extending through the alternating stack (32, 46); an epitaxial channel portion 11 located at a bottom of the memory opening and contacting a portion of the substrate (9, 10), wherein the epitaxial channel portion 11 comprises a chamfer 11C having an upper edge that adjoins a periphery of a horizontal top surface 11H of the epitaxial channel portion 11 and a lower edge that adjoins a dielectric portion (e.g., the dielectric collar structure 501 or annular dielectric spacer 611) that is formed at a sidewall of the memory opening and which functions as a gate dielectric of a select transistor of a vertical NAND string; and a memory stack structure 55 overlying the epitaxial channel portion 11 and located in the memory opening.

In each of the above embodiments, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels 60 which may include layers 601, 602. At least one end portion of each of the plurality of semiconductor channels 60 extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (e.g., semiconductor well layer 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case an exemplary structure of the present disclosure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). A vertical stack of charge storage regions (as embodied as regions of the memory material layer 504 located at levels of the electrically conductive layers 46) laterally surrounds the tunneling dielectric 506. At least one end portion of the semiconductor channel (601, 602) extends substantially perpendicular to the top surface of the semiconductor substrate through the stack (32, 46).

The dielectric collar portion 501 may comprise a vertical portion of a gate dielectric of a bottom select transistor of a vertical NAND string. Layer 12 may comprise the horizontal portion of the gate dielectric of the bottom select transistor. The bottom electrically conductive layer 46 or 142 may function as the gate electrode of the select gate transistor. The top portion of the semiconductor well layer 10 and the epitaxial channel portion 11 may function as horizontal and vertical portions of a channel of the select gate transistor.

The embodiments of the present disclosure may have one or more of the following non-limiting advantages. The embodiment methods may reduce or avoid unintentional etching of the epitaxial channel portion 11. The embodiment methods may reduce or avoid shorts between the bottom select gate electrode and the semiconductor well layer 10 or the epitaxial channel portion 11, particularly at the corner between layer 10 and portion 11. The embodiment methods may also reduce or avoid non-uniform vertical select gate transistor gate dielectric formation and undesired curvature. The embodiment methods may also reduce or avoid etching of the silicon epitaxial channel portion 11 by hot phosphoric acid during selective etching of the silicon nitride sacrificial material layers 42. Consequently, current leakage at the corner of the bottoms elect gate transistor and/or breakdown by non-uniformity of its gate dielectric may be reduced or avoided. The embodiment methods may also reduce or avoid oxidizing of the silicon nitride charge storage layer 504 in the memory film 50. Finally, the embodiment methods may also reduce or avoid forming facets and non-uniform top surface of the epitaxial channel portion 11.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
   an alternating stack of insulating layers and electrically conductive layers located over a substrate;
   a memory opening extending through the alternating stack;

an epitaxial channel portion located at a bottom of the memory opening and contacting a portion of the substrate;

a memory stack structure overlying the epitaxial channel portion and located in the memory opening; and a dielectric collar structure laterally surrounding at least the epitaxial channel portion and having a first thickness region having a first thickness and a second thickness region having a second thickness that is greater than the first thickness, the second thickness region being located at a level of one of the electrically conductive layers and contacting an outer sidewall of the epitaxial channel portion.

2. The three-dimensional memory device of claim 1, wherein an outer sidewall of the second thickness region protrudes outward from a vertical plane including an outer sidewall of the first thickness region.

3. The three-dimensional memory device of claim 2, wherein an inner sidewall of the first thickness region is recessed inward from a vertical plane including an inner sidewall of the second thickness region.

4. The three-dimensional memory device of claim 2, wherein an inner sidewall of the second thickness region is located within a same vertical plane as an inner sidewall of the first thickness region.

5. The three-dimensional memory device of claim 1, wherein:
an outer sidewall of the first thickness region contacts a sidewall of a semiconductor material layer in the substrate; and
an inner sidewall of the first thickness region contacts a sidewall of the epitaxial channel portion.

6. The three-dimensional memory device of claim 5, wherein the first thickness region underlies the second thickness region.

7. The three-dimensional memory device of claim 1, wherein the memory stack structure comprises a blocking dielectric contacting a sidewall of the memory opening, contacting a top surface of the epitaxial channel portion, and having an outer sidewall that is vertically coincident with an outer sidewall of the first thickness region.

8. The three-dimensional memory device of claim 1, wherein a bottom surface of the dielectric collar structure overlies a topmost surface of the substrate.

9. The three-dimensional memory device of claim 8, wherein the first thickness region overlies the second thickness region.

10. The three-dimensional memory device of claim 1, wherein the memory stack structure comprises a blocking dielectric contacting an inner sidewall of the first thickness region and contacting a top surface of the epitaxial channel portion.

11. The three-dimensional memory device of claim 1, wherein each of the memory stack structures comprises, from inside to outside:
a semiconductor channel;
a tunneling dielectric laterally surrounding the semiconductor channel; and
charge storage regions laterally surrounding the tunneling dielectric.

12. The three-dimensional memory device of claim 1, wherein:
the three-dimensional memory device comprises a vertical NAND device formed in a device region;
the electrically conductive layers comprise, or are electrically connected to a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrode and extend from the device region to a contact region including the plurality of electrically conductive via connections; and
the substrate comprises a silicon substrate containing a driver circuit for the NAND device.

\* \* \* \* \*